(12) United States Patent
Yamamoto

(10) Patent No.: US 11,981,107 B2
(45) Date of Patent: May 14, 2024

(54) METHOD FOR MANUFACTURING CLAD MATERIAL

(71) Applicant: HITACHI METALS, LTD., Tokyo (JP)

(72) Inventor: Shinji Yamamoto, Suita (JP)

(73) Assignee: PROTERIAL, LTD., Tokyo (JP)

( * ) Notice: Subject to any disclaimer, the term of this patent is extended or adjusted under 35 U.S.C. 154(b) by 0 days.

(21) Appl. No.: 17/681,996

(22) Filed: Feb. 28, 2022

(65) Prior Publication Data
US 2022/0176676 A1 Jun. 9, 2022

Related U.S. Application Data

(62) Division of application No. 16/634,228, filed as application No. PCT/JP2018/020405 on May 28, 2018, now Pat. No. 11,607,867.

(30) Foreign Application Priority Data

Aug. 9, 2017 (JP) .................. 2017-154136

(51) Int. Cl.
*B23K 20/00* (2006.01)
*B23K 20/04* (2006.01)
(Continued)

(52) U.S. Cl.
CPC ............ *B32B 15/015* (2013.01); *B23K 20/04* (2013.01); *B23K 2103/05* (2018.08);
(Continued)

(58) Field of Classification Search
CPC .. B23K 20/04; B23K 2103/22; B23K 20/227; B23K 20/02; B23K 2103/12;
(Continued)

(56) References Cited

U.S. PATENT DOCUMENTS 3,923,558 A * 12/1975 Shapiro ............... C22C 9/02
148/412
3,985,589 A * 10/1976 Shapiro ............... C22F 1/08
148/414

(Continued)

FOREIGN PATENT DOCUMENTS

CN 102986066 A 3/2013
CN 103858529 A 6/2014
(Continued)

OTHER PUBLICATIONS

Office Action dated Mar. 9, 2022, issued in counterpart CN application No. 201880048287.1, with English Translation. (13 pages).
(Continued)

*Primary Examiner* — Erin B Saad
(74) *Attorney, Agent, or Firm* — WHDA, LLP

(57) ABSTRACT

The method is for manufacturing a clad material (30), which includes: clad rolling for rolling and bonding a first metal plate (131) made of stainless steel, a second metal plate (132) made of Cu or a Cu alloy, and a third metal plate (133) made of stainless steel in a state in which the first metal plate, the second metal plate, and the third metal plate are stacked in this order. The clad rolling is performed with a pressure-bonding load of $4.4 \times 10^3$ N/mm or more. The second layer is made of Cu or a Cu alloy. The third layer is made of stainless steel. The clad material has an overall thickness of 1 mm or less.

4 Claims, 7 Drawing Sheets

(51) Int. Cl.
  *B32B 15/01* (2006.01)
  *B23K 103/04* (2006.01)
  *B23K 103/12* (2006.01)
  *B23K 103/22* (2006.01)
  *H05K 5/04* (2006.01)

(52) U.S. Cl.
  CPC ...... *B23K 2103/12* (2018.08); *B23K 2103/22* (2018.08); *H05K 5/04* (2013.01)

(58) Field of Classification Search
  CPC .... B23K 11/002; C21D 1/26; C21D 2251/02; C21D 2251/00; B32B 15/015; B32B 15/013; B32B 15/18
  See application file for complete search history.

(56) References Cited

U.S. PATENT DOCUMENTS

| | | | |
|---|---|---|---|
| 4,699,841 A * | 10/1987 | Kundinger | B32B 15/08 428/383 |
| 2004/0197598 A1 | 10/2004 | Imai et al. | |
| 2013/0130119 A1 | 5/2013 | Majima et al. | |
| 2013/0209874 A1* | 8/2013 | Yoshida | B32B 15/01 429/211 |
| 2014/0356224 A1* | 12/2014 | Shishido | C22C 9/06 420/490 |
| 2015/0190985 A1 | 7/2015 | Oda et al. | |
| 2016/0190598 A1 | 6/2016 | Majima et al. | |
| 2020/0024698 A1* | 1/2020 | Tsujie | C22F 1/08 |

FOREIGN PATENT DOCUMENTS

| | | |
|---|---|---|
| JP | 2003-105500 A | 4/2003 |
| JP | 2005-134073 A | 5/2005 |
| JP | 2005-219478 A | 8/2005 |
| JP | 5410646 B1 | 2/2014 |
| KR | 10-2014-0046083 A | 4/2014 |

OTHER PUBLICATIONS

Office Action dated Jun. 27, 2022, issued in counterpart KR Application No. 10-2020-7000405, with English Translation. (11 pages).
Office Action dated Jul. 7, 2022, issued in counterpart CN Application No. 201880048287.1, with English Translation. (7 pages).
International Search Report dated Aug. 21, 2018, issued in counterpart International Application No. PCT/JP2018/020405 (1 page).
Extended Search Report dated Mar. 19, 2021, issued in counterpart EP Application No. 18845236.1 (7 pages).
Dehghani, Farshid et al. "Analytical and experimental analysis of the formability of copper-stainless steel 304L clad metal sheets in deep drawing", The International Journal of Advanced Manufacturing Technology, London, vol. 82, No. 1, Jun. 9, 2015, pp. 163-177; Cited in EESR dated Mar. 19, 2021.
Office Action dated Mar. 25, 2021, issued in counterpart CN Application No. 201880048287.1, with English Translation. (11 pages).
Office Action dated Nov. 18, 2021, issued in counterpart CN Application No. 201880048287.1, with machine translation. (16 pages).
M. Hosseini etal. "Bond strength optimization of Ti/Cu/Ti clad composites produced by roll-bonding", 2015, Materials and Design, 81, p. 122-132. (Year 2015).

* cited by examiner

METHOD FOR MANUFACTURING CLAD MATERIAL

CROSS-REFERENCE TO RELATED APPLICATIONS

This application is a divisional of U.S. application Ser. No. 16/634,228, filed on Jan. 27, 2020, which is a 371 of International Application No. PCT/JP2018/020405, filed on May 28, 2018, which is based upon and claims the benefit of priority from the prior Japanese Patent Application No. 2017-154136, filed on Aug. 9, 2017.

TECHNICAL FIELD

The present invention relates to a clad material and a method for manufacturing the clad material.

BACKGROUND ART

In general, a clad material in which a first layer and a third layer made of stainless steel and a second layer made of Cu or a Cu alloy arranged between the first layer and the third layer are roll-bonded to each other is disclosed in Japanese Patent Laid-Open No. 2005-219478, for example.

In a clad plate disclosed in Japanese Patent Laid-Open No. 2005-219478, covering layers (first and third layers) made of stainless steel are respectively roll-bonded to both sides of a center layer (second layer) made of copper or a copper alloy, and the covering layers are bonded to the center layer through barrier layers made of Nb or the like. Furthermore, the clad plate is roll-bonded by a thickness reduction process such as hot rolling or warm/cold rolling.

PRIOR ART DOCUMENT

Patent Document

Patent Document 1: Japanese Patent Laid-Open No. 2005-219478

SUMMARY OF THE INVENTION

Problems to be Solved by the Invention

As a result of various studies, the inventor of the present invention has found that in the clad material disclosed in Japanese Patent Laid-Open No. 2005-219478, a portion having an excessively small thickness may be generated in the first layer or the third layer made of stainless steel, and thus when the clad material is welded to another member, the weld strength may decrease, and the mechanical strength of the clad material may vary.

The present invention has been proposed in order to solve the aforementioned problems, and an object of the present invention is to provide a clad material and a method for manufacturing the clad material capable of significantly reducing or preventing a decrease in the weld strength at the time of welding the clad material to another member and a variation in the mechanical strength of the clad material.

Means for Solving the Problems

As a result of earnest investigations in order to solve the aforementioned problems, the inventor of the present invention has further found that due to the minimum thickness of the first layer in the stacking direction and the minimum thickness of the third layer in the stacking direction, respectively, being excessively smaller than target thicknesses (target values), the welding strength may decrease when the clad material is welded to another member, and a variation in the mechanical strength of the clad material occurs. The present invention has been completed based on this finding. That is, a clad material according to a first aspect of the present invention includes a first layer made of stainless steel, a second layer made of Cu or a Cu alloy and roll-bonded to the first layer, and a third layer made of stainless steel and roll-bonded to a side of the second layer opposite to the first layer and has an overall thickness of 1 mm or less, and in a cross-sectional view along a stacking direction, a minimum thickness of the first layer in the stacking direction and a minimum thickness of the third layer in the stacking direction are 70% or more and less than 100% of an average thickness of the first layer in the stacking direction and an average thickness of the third layer in the stacking direction, respectively.

Note that "stainless steel" refers to an alloy containing 50 mass % or more of Fe (iron) as a main component and further containing at least 10.5 mass % or more of Cr (chromium). Furthermore, "Cu alloy" refers to an alloy containing 50 mass % or more of Cu (copper) as a main component. In addition, "the minimum thickness of the first layer in the stacking direction" and "the minimum thickness of the third layer in the stacking direction" respectively refer to the minimum value of the thickness of the first layer and the minimum value of the thickness of the third layer in a range of a predetermined length along a rolling direction of the clad material in the cross-sectional view along the stacking direction.

In the clad material according to the first aspect of the present invention, as described above, in the cross-sectional view along the stacking direction, the minimum thickness of the first layer in the stacking direction and the minimum thickness of the third layer in the stacking direction are set to 70% or more and less than 100% of the average thickness of the first layer in the stacking direction and the average thickness of the third layer in the stacking direction, respectively. The clad material is configured in this manner such that the thicknesses of the first layer and the third layer in the stacking direction are equalized, and thus the occurrence of portions having excessively small thicknesses (less than 70% of the average thicknesses) in the first layer and the third layer can be significantly reduced or prevented. Consequently, it is possible to significantly reduce or prevent a decrease in welding strength when the clad material is welded to another member and to significantly reduce or prevent the occurrence of a variation in the mechanical strength of the clad material. Therefore, when the clad material is welded to another member, for example, welding of another member to the portion of the first layer having an excessively small thickness or the portion of the third layer having an excessively small thickness can be significantly reduced or prevented, and thus a decrease in welding strength due to insufficient welding can be significantly reduced or prevented. In addition, a variation in the mechanical strength of the clad material can occur, and thus it is possible to significantly reduce or prevent the occurrence of variations in characteristics such as mechanical strength in a product produced from the clad material. The advantageous effect of this configuration is particularly effective when the overall thickness is as small as 1 mm or less and the average thicknesses of the first layer and the third layer are small (0.20 mm or less, for example). Furthermore, the occurrence of the portion having an excessively small thickness in the first layer and the portion having an excessively small thickness in the third layer is significantly reduced or prevented such that it is possible to significantly reduce or prevent uncovering of the second layer due to tearing or pinholes occurring in the first layer and the third layer at the time of rolling.

As described above, the clad material according to the first aspect includes the first layer made of stainless steel, the second layer made of Cu or a Cu alloy and roll-bonded to the first layer, and the third layer made of stainless steel and roll-bonded to the side of the second layer opposite to the first layer. The clad material is configured in this manner such that its mechanical strength and corrosion resistance can be ensured by the first layer and the third layer made of stainless steel while its conductivity and thermal conductivity can be ensured by the second layer made of Cu or a Cu alloy. Consequently, the clad material suitable for a conductive member for batteries and a chassis that also serves as a heat sink can be provided.

In the aforementioned clad material according to the first aspect, a percentage of a standard deviation of the minimum thickness of the first layer with respect to a thickness of the clad material and a percentage of a standard deviation of the minimum thickness of the third layer with respect to the thickness of the clad material are preferably 1.5% or less. The clad material is configured in this manner such that the minimum thickness of the first layer in the stacking direction and the minimum thickness of the third layer in the stacking direction are further equalized, and thus the occurrence of the portion having an excessively small thickness in the first layer and the portion having an excessively small thickness in the third layer (the portions having thicknesses of less than 70% of the average thicknesses) can be further significantly reduced or prevented. Consequently, the occurrence of the portion having an excessively small thickness in the first layer made of stainless steel and the portion having an excessively small thickness in the third layer made of stainless steel can be further significantly reduced or prevented. Therefore, the decrease in the welding strength as described above can be further significantly reduced or prevented. Furthermore, the variations in the characteristics of the product produced from the clad material as described above can be further significantly reduced or prevented. The advantageous effect of this configuration is particularly effective when the average thicknesses of the first layer and the third layer are small.

In the clad material according to the first aspect, the first layer and the third layer are preferably both made of austenitic stainless steel. The clad material is configured in this manner such that the austenitic stainless steel and the Cu or Cu alloy are both non-magnetic such that the entire clad material can be non-magnetic. Accordingly, other components (electronic components, for example) can be prevented from being adversely affected due to magnetization of the chassis when the clad material is used for the chassis that also serves as a heat sink, for example.

A method for manufacturing a clad material according to a second aspect of the present invention includes clad rolling for rolling and bonding a first metal plate made of stainless steel, a second metal plate made of Cu or a Cu alloy, and a third metal plate made of stainless steel in a state in which the first metal plate, the second metal plate, and the third metal plate are stacked in this order, and the clad rolling is performed with a pressure-bonding load of $4.4 \times 10^3$ N/mm or more such that the clad material including a first layer made of stainless steel, a second layer made of Cu or a Cu alloy and roll-bonded to the first layer, and a third layer made of stainless steel and roll-bonded to a side of the second layer opposite to the first layer, the clad material having an overall thickness of 1 mm or less, in which in a cross-sectional view along a stacking direction, a minimum thickness of the first layer in the stacking direction and a minimum thickness of the third layer in the stacking direction are 70% or more and less than 100% of an average thickness of the first layer in the stacking direction and an average thickness of the third layer in the stacking direction, respectively, is produced. Note that "a pressure-bonding load" in the present invention refers to a resultant force acting on a roller from a rolled material (in the present invention, the first metal plate, and the second metal plate, and the third metal plate) in clad rolling and a force per unit length. This pressure-bonding load may be referred to as a rolling load or a roll force.

In the method for manufacturing a clad material according to the second aspect of the present invention, as described above, the clad rolling is performed with a pressure-bonding load of $4.4 \times 10^3$ N/mm or more in a state in which the first metal plate made of stainless steel, the second metal plate made of Cu or a Cu alloy, and the third metal plate made of stainless steel are stacked in this order. Thus, the clad rolling is performed with a pressure-bonding load of $4.4 \times 10^3$ N/mm or more, and thus it is possible to significantly reduce or prevent each layer from being rolled in such a manner as to plastically deform non-uniformly due to a difference between the ductility of the first metal plate and the third metal plate made of stainless steel and the ductility of the second metal plate made of Cu or a Cu alloy. Consequently, in the clad material, the non-uniform thickness of the first layer in the stacking direction and the non-uniform thickness of the third layer in the stacking direction can both be significantly reduced or prevented, and thus the occurrence of the portion having an excessively small thickness in the first layer or the third layer made of stainless steel can be significantly reduced or prevented. Furthermore, the occurrence of the portions having excessively small thicknesses in the first layer and the third layer is significantly reduced or prevented such that it is possible to significantly reduce or prevent uncovering of the second layer due to tearing or pinholes occurring in the first layer and the third layer at the time of rolling.

In the aforementioned method for manufacturing a clad material according to the second aspect, the pressure-bonding load is preferably set to $4.9 \times 10^3$ N/mm or more. Accordingly, the clad rolling can be performed with a more sufficient pressure-bonding load, and thus it is possible to further significantly reduce or prevent each layer from being rolled in such a manner as to plastically deform non-uniformly.

In the aforementioned method for manufacturing a clad material according to the second aspect, it is preferably assumed that a prepared second metal plate has been work-hardened by being subjected to temper rolling after annealing. Accordingly, as the second metal plate made of Cu or a Cu alloy, a second metal plate, the mechanical strength (such as 0.2% proof stress) of which has been improved due to accumulation of the internal stress (strain), can be used. Consequently, the mechanical strength of the second metal plate, which is lower in mechanical strength than the first metal plate and the third metal plate made of stainless steel, can be closer to the mechanical strength of the first metal plate and the third metal plate. Therefore, the clad rolling can be performed on the metal plates having similar mechanical strength, and thus each layer is rolled in such a manner as to plastically deform more uniformly. Thus, the first metal plate, the second metal plate, and the third metal plate can be sufficiently bonded to each other, and the thickness of each layer can be formed with a high degree of accuracy.

In this case, it is preferably assumed that a thickness of the prepared second metal plate after the temper rolling is 60% or more and less than 100% of the thickness of the prepared second metal plate before the temper rolling. Accordingly, excessive accumulation of internal stress (strain) in the prepared second metal plate due to the thickness of the prepared second metal plate after the temper rolling of less than 60% of the thickness of the prepared second metal plate before the temper rolling can be significantly reduced or prevented. Consequently, grain coarsening of the second layer (second metal plate) due to large internal stress (strain) can be significantly reduced or prevented, and thus a decrease in the elongation (workability) of the clad material due to the second layer can be significantly reduced or prevented.

Effect of the Invention

According to the present invention, as described above, it is possible to provide a clad material and a method for manufacturing the clad material capable of significantly reducing or preventing a decrease in the weld strength at the time of welding the clad material to another member and a variation in the mechanical strength of the clad material.

MODES FOR CARRYING OUT THE INVENTION

An embodiment embodying the present invention is hereinafter described on the basis of the drawings.
(Configuration of Portable Device)

A schematic configuration of a portable device 100 using a clad material 30 as a chassis 3 according to an embodiment of the present invention is now described with reference to FIGS. 1 and 2.

Figure 1:
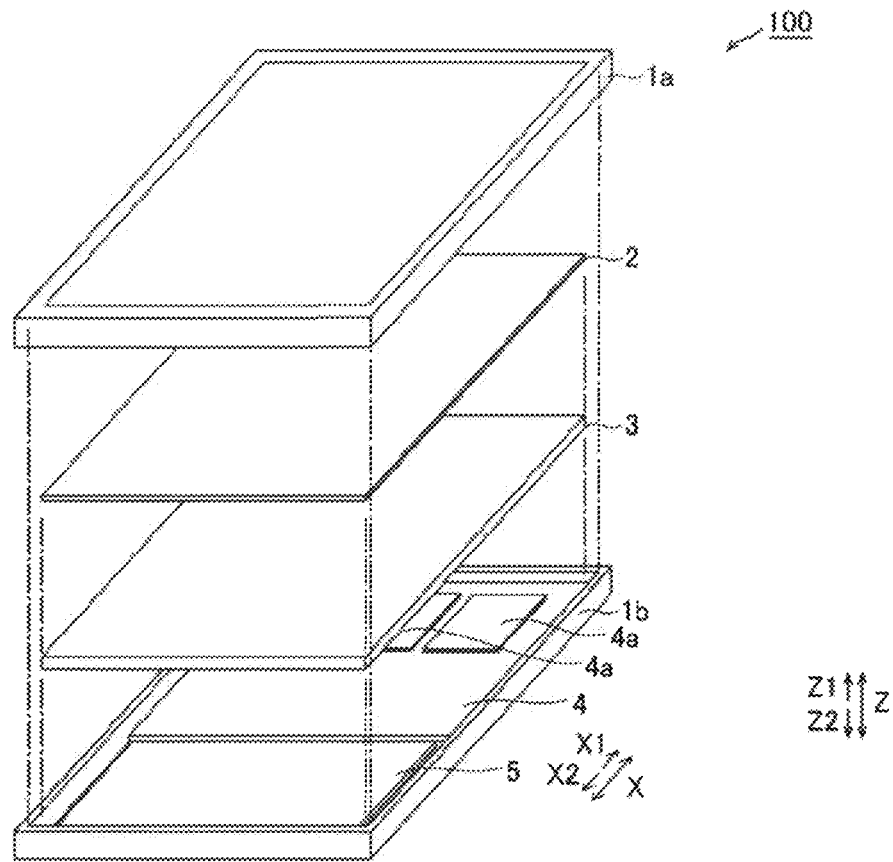
FIG. 1 An exploded perspective view schematically showing a portable device using a clad material according to an embodiment of the present invention as a chassis.

As shown in FIG. 1, the portable device 100 according to this embodiment includes an upper housing 1a, a display 2, the chassis 3, a substrate 4, a battery 5, and a lower housing 1b. The display 2, the chassis 3, the substrate 4, and the battery 5 are arranged in the lower housing 1b in this order from above (Z1 side). The lower housing 1b is covered by the upper housing 1a from above.

The display 2 is a liquid crystal display or an organic EL display, for example, and has a function of displaying an image on the upper surface on the Z1 side.

The chassis 3 has a function of ensuring the mechanical strength of the portable device 100 and a function of releasing heat from the display 2, the substrate 4 (electronic components 4a), and the battery 5 to the outside. That is, the chassis 3 also serves as a heat sink. A member (not shown) of the portable device 100 is welded to the chassis 3.

The substrate 4 is arranged on the X1 side of the lower housing 1b, and the battery 5 is arranged on the X2 side. The electronic components 4a, such as a central processing unit (CPU) configured to drive an application, are arranged on the upper surface of the substrate 4 on the Z1 side.
(Configuration of Chassis (Clad Material))

Figure 2:
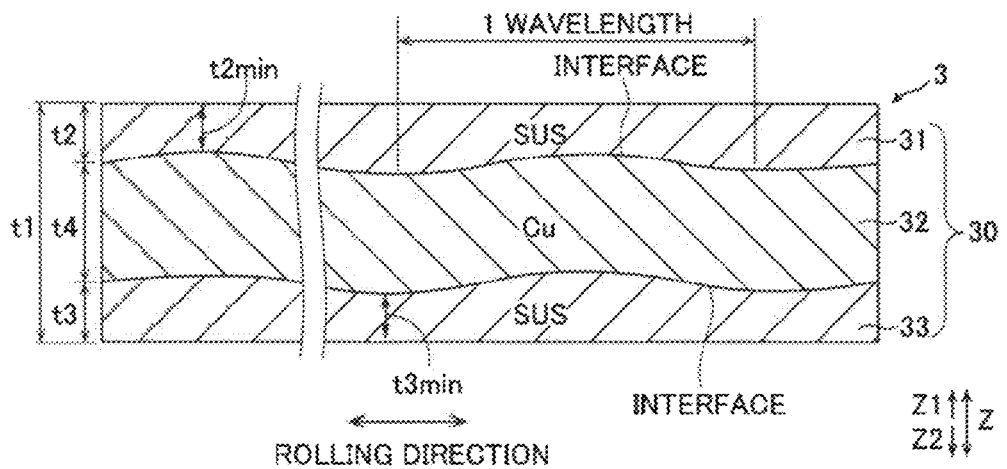
FIG. 2 A cross-sectional view showing the structure of the clad material (chassis) according to the embodiment of the present invention.

As shown in FIG. 2, the chassis 3 is made of the three-layer clad material 30 in which a SUS layer 31 made of stainless steel, a Cu layer 32 made of Cu or a Cu alloy, and a SUS layer 33 made of stainless steel are stacked in this order. The Cu layer 32 is roll-bonded to a Z1 side surface (upper surface) of the SUS layer 33, and is roll-bonded to a Z2 side surface (lower surface) of the SUS layer 31. At an interface between the SUS layer 31 and the Cu layer 32 and at an interface between the Cu layer 32 and the SUS layer 33, the layers are firmly bonded to each other by forming an interatomic bond by diffusion annealing. Furthermore, a member (not shown) of the portable device 100 is welded to the SUS layer 31 and the SUS layer 33. The SUS layer 31, the Cu layer 32, and the SUS layer 33 are examples of a "first layer", a "second layer", and a "third layer" in the claims, respectively.

The thickness t1 of the clad material 30 in a Z direction is not particularly limited. In this embodiment, the thickness t1 of the chassis 3 is preferably 1 mm or less, and more preferably 0.5 mm or less in order to significantly reduce or prevent an increase in the thickness in the Z direction in consideration of weight reduction and compactness of the portable device 100. Furthermore, in order to ensure the mechanical strength of the chassis 3 and to significantly reduce or prevent difficulty in manufacturing, the thickness t1 of the chassis 3 is preferably 0.03 mm or more, more preferably 0.05 mm or more, and still more preferably 0.1 mm or more. From the viewpoint of heat dissipation, the Cu layer 32 is preferably thicker than the SUS layers (31, 33). However, when the thickness of the Cu layer 32 is too large, the thicknesses of the SUS layers (31, 33) become small, and tearing or pinholes may occur when the Cu layer 32 is roll-bonded. Consequently, a portion of the Cu layer 32 not covered with the SUS layers (31, 33) may be generated. Therefore, the layer thickness ratio (SUS layer:Cu layer: SUS layer) is preferably such that when the thickness of the SUS layer is 1, the thickness of the Cu layer is 2 or more and 8 or less (1:2:1 to 1:8:1).

The stainless steel making up the SUS layer 31 and the SUS layer 33 is not particularly limited as long as the same is stainless steel, such as austenitic, ferritic, and martensitic stainless steel. In this embodiment, it is not preferable to magnetize the chassis 3 in the portable device 100 including the electronic components 4a (see FIG. 1). Therefore, the stainless steel making up the SUS layer 31 and the SUS layer 33 is preferably austenitic stainless steel, and more preferably so-called SUS300 (JIS standards) austenitic stainless steel.

Furthermore, the stainless steel making up the SUS layer 31 and the SUS layer 33 is particularly preferably SUS316L (JIS standards), which has a low C (carbon) content and is less magnetic, of the austenitic stainless steel. Note that SUS316L is austenitic stainless steel with a reduced C content of SUS316 (JIS standards) containing 18 mass % of Cr, 12 mass % of Ni, 2.5 mass % of Mo, inevitable impurities including C, and the balance Fe (iron). The SUS layer 31 and the SUS layer 33 are not limited to the same composition, but are preferably made of stainless steel having the same composition in consideration of rolling stability etc.

The Cu layer 32 is made of Cu of C1000 series (JIS standards) or a Cu alloy such as C2000 series (JIS standards). As the copper, there are so-called oxygen-free copper, phosphorus deoxidized copper, tough pitch copper, etc. As the Cu alloy, a Zr—Cu alloy of C1050 (JIS standards), for example, is preferable in order to significantly reduce or prevent grain coarsening. The Cu or Cu alloy making up the Cu layer 32 generally has higher thermal conductivity and greater ductility than the stainless steel making up the SUS layer 31 and the SUS layer 33. Furthermore, the grain size of the Cu layer 32 (Cu or Cu alloy) measured by a comparison method of JIS H 0501 is preferably 0.150 mm or less, and a decrease in the elongation (ductility) of the Cu layer 32 can be significantly reduced or prevented.

In the clad material 30 according to this embodiment, the SUS layers 31 and 33 have variations in the thicknesses t2 and t3 along a rolling direction, respectively. Consequently, the SUS layers 31 and 33 have portions having minimum thicknesses t2 min and t3 min smaller than the thicknesses t2 and t3 of the other portions, respectively. On the other hand, the thickness t4 of the Cu layer 32 hardly varies. Consequently, when the thicknesses t2 and t3 vary, the interfaces of the clad material 30 become wavy in a cross-sectional view along a stacking direction (Z direction). In FIG. 2, the wave shapes of the interfaces are exaggerated.

In this embodiment, in the clad material 30, the minimum thickness t2 min of the SUS layer 31 in the stacking direction and the minimum thickness t3 min of the SUS layer 33 in the stacking direction are 70% or more and less than 100% of the average thickness t2avg of the SUS layer 31 in the stacking direction and the average thickness t3avg of the SUS layer 33 in the stacking direction in the cross-sectional view along the stacking direction (Z direction), respectively.

The minimum thickness t2 min of the SUS layer 31 in the stacking direction is the minimum thickness t2 of the SUS layer 31 in a predetermined range (length) in the rolling direction of the clad material 30. Similarly, the minimum thickness t3 min of the SUS layer 33 in the stacking direction is the minimum thickness t3 of the SUS layer 33 in a predetermined range (length) in the rolling direction of the clad material 30. The predetermined range (length) of the clad material 30 is not particularly limited as long as the same is in a range of one or more wavelengths of the wave of the interface formed in a wave shape, but the same is preferably at least about 15 mm from the viewpoint of measurement reliability. Furthermore, the average thickness t2avg of the SUS layer in the stacking direction is the average of the thickness t2 of the SUS layer 31 in the clad material 30. Similarly, the average thickness t3avg of the SUS layer 33 in the stacking direction is the average of the thickness t3 of the SUS layer 33 in the clad material 30. Note that it is better to obtain the average thicknesses t2avg and t3avg by randomly measuring the thicknesses t2 and t3 at a plurality of portions (ten or more portions, for example) of the SUS layers 31 and 33 in the predetermined range (length) described above, for example, of the clad material 30 and calculating the averages of the plurality of measured thicknesses t2 and t3. On the other hand, it is better to obtain the thickness t4 of the Cu layer 32 as the average thickness t4avg (there is almost no variation, and thus it is hereinafter simply referred to as "t4") in the same manner as the average thicknesses t2avg and t3avg of the SUS layers 31 and 33 described above.

The percentage (%) of the standard deviation of the minimum thickness t2 min of the SUS layer 31 with respect to the thickness t1 of the clad material 30 and the percentage (%) of the standard deviation of the minimum thickness t3 min of the SUS layer 33 with respect to the thickness t1 of the clad material 30 are both preferably 1.5% or less, and more preferably 1.2% or less. When the standard deviation is obtained, it is preferable to acquire the minimum thicknesses t2 min and t3 min of more portions (one hundred or more portions, for example).

When the composition (material) of the stainless steel making up the SUS layer 31 and the composition (material) of the stainless steel making up the SUS layer 33 are the same while the thickness ratios (t2avg/t1, t3avg/t1) of the average thicknesses (t2avg, t3avg) to the thickness (t1) of the clad material 30 are the same, the minimum thicknesses and variations in the minimum thicknesses in the SUS layer 31 and the SUS layer 33 are conceivably equal. Therefore, in this case, data of the SUS layer 31 and data of the SUS layer 33 can be combined and evaluated to be treated as the minimum thickness and the standard deviation of a pair of SUS layers.

The ratio (t2avg:t4:t3avg) of the average thickness t2avg of the SUS layer 31, the thickness t4 of the Cu layer 32, and the average thickness t3avg of the SUS layer 33 in the clad material 30 is not particularly limited. Note that in order to equalize the degree of elongation in clad rolling or the like on both sides in the Z direction, the average thickness t2avg of the SUS layer 31 and the average thickness t3avg of the SUS layer 33, both of which are made of stainless steel, are preferably substantially equal.

It is preferable to vary the thickness ratio according to the characteristics (thermal conductivity and mechanical strength) required for the chassis 3. For example, when the mechanical strength is particularly required in the chassis 3, it is preferable to increase the average thicknesses t2avg and t3avg of the SUS layers 31 and 33 made of stainless steel having high mechanical strength. In order to ensure the mechanical strength of the clad material 30, the thickness t4 of the Cu layer 32 is preferably 60% or less of the thickness t1 of the clad material 30. On the other hand, when the thermal conductivity is particularly required for the chassis 3, it is preferable to increase the thickness t4 of the Cu layer 32. In order to ensure the thermal conductivity of the clad material 30, the thickness t4 of the Cu layer 32 is preferably 33% or more of the thickness t1 of the clad material 30. Furthermore, the elongation of the clad material 30 is preferably 8% or more, and more preferably 10% or more from the viewpoint of press workability, for example.

(Outline of Method for Manufacturing Chassis (Clad Material))

A method for manufacturing the clad material 30 making up the chassis 3 according to the embodiment of the present invention is now described with reference to FIGS. 2 to 6.

Figure 3:
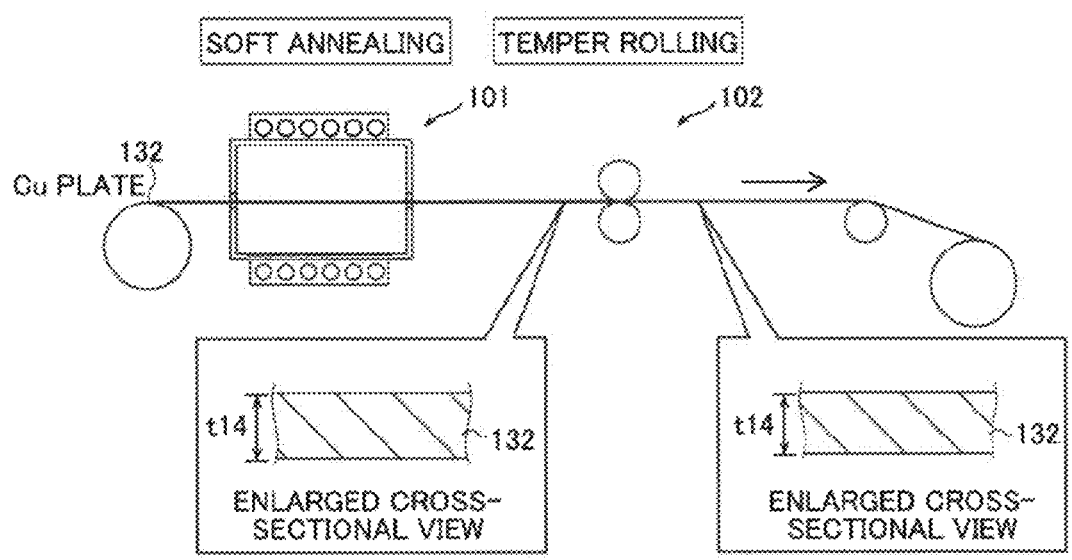
FIG. 3 A schematic view for illustrating a clad material manufacturing process according to the embodiment of the present invention.

First, as shown in FIG. 3, a strip-shaped Cu plate 132 made of Cu or a Cu alloy is prepared. Then, soft annealing is performed on the Cu plate 132 using an annealing furnace 101 in which the internal temperature is set to a temperature exceeding the recrystallization temperature (220° C., for example) of the Cu or Cu alloy making up the Cu plate 132. Thus, the Cu plate 132 is in a state in which the internal strain due to work-hardening is removed and the structure is sufficiently softened.

Then, temper rolling is performed on the Cu plate 132 that has undergone the soft annealing using a roller 102. By the temper rolling, the Cu plate 132 accumulates internal stress (strain) and is work-hardened. Furthermore, the number of temper rolling passes can be selected as appropriate.

In the temper rolling, rolling is preferably performed in such a manner that the thickness t14 of the Cu plate 132 after the temper rolling is 60% or more and less than 100% of the thickness t14 of the Cu plate 132 before the temper rolling. Thus, during clad rolling described below, the ductility of SUS plates 131 and 133 made of stainless steel having high MECHANICAL STRENGTH and low ductility and the ductility of a Cu plate 132 made of Cu or a Cu alloy having low mechanical strength and high ductility can be close to each other.

The thickness t14 of the Cu plate 132 after the temper rolling is set to 60% or more of the thickness t14 of the Cu plate 132 before the temper rolling such that grain coarsening of the Cu layer 32 of the clad material 30 can be easily significantly reduced or prevented. Thus, it can be assumed that the prepared Cu plate 132 has been work-hardened by being subjected to the temper rolling after the annealing.

Figure 4:
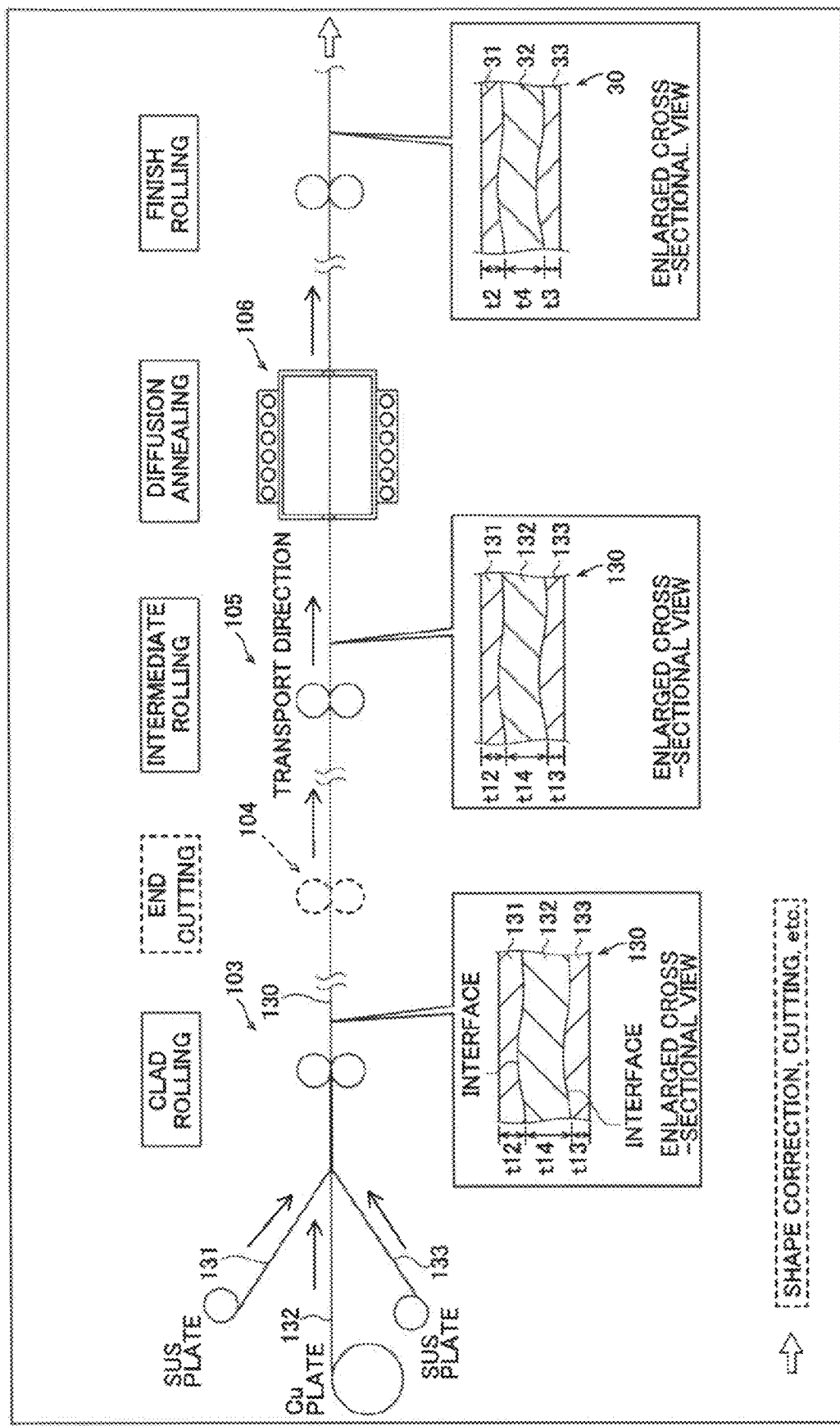
FIG. 4 A schematic view for illustrating the clad material manufacturing process according to the embodiment of the present invention.

As shown in FIG. 4, in addition to the strip-shaped Cu plate 132 that has undergone the temper rolling after the annealing, the strip-shaped SUS plate 131 and the strip-shaped SUS plate 133 made of stainless steel are prepared. Furthermore, both the SUS plates 131 and 133 are sufficiently annealed. The thickness of the SUS plate 131, the thickness of the Cu plate 132 that has undergone the temper rolling, and the thickness of the SUS plate 133 are appropriately selected according to the thickness ratios (t2avg:t4:t3avg) of the SUS layer 31, the Cu layer 32, and the SUS layer 33 in the clad material 30 to be produced.

Then, the clad rolling is performed to roll and bond the sufficiently annealed SUS plate 131, the Cu plate 132 that has undergone the temper rolling after the annealing, and the sufficiently annealed SUS plate 133 using a roller 103 in a state in which the same are stacked in this order. Thus, a pressure-bonded material 130 having a thickness of 1.0 mm or less or 0.5 mm or less, for example, in which the SUS plate 131, the Cu plate 132, and the SUS plate 133 have been bonded (roll-bonded) to each other in a state in which the same are stacked in this order, is produced. The number of clad rolling passes can be selected as appropriate.

Figure 5:
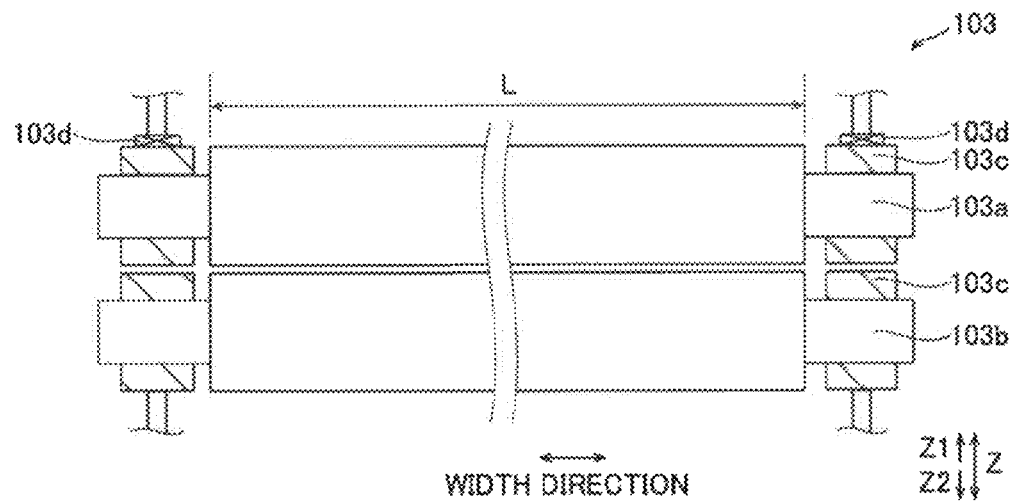
FIG. 5 A front view showing a roller configured to produce the clad material according to the embodiment of the present invention.

As shown in FIG. 5, the roller 103 includes a pair of work rollers 103a and a pair of work rollers 103b, four bearings 103c that respectively hold shafts of the work rollers 103a and 103b, and a pair of load cells 103d attached to the bearings 103c of the work rollers 103a on the Z1 side, for example. The pair of load cells 103d have a function of detecting a force (resultant force) P0 (N) that acts on the work rollers 103a from the SUS plate 131, the Cu plate 132, and the SUS plate 133 (rolled material) by detecting the strain caused by the force (resultant force) that acts on the work rollers 103a.

When the clad rolling is performed, it is important to first determine a pressure-bonding load. As described in "Plate Rolling" (edited by the Japan Society for Technology of Plasticity, Corona Publishing Co., Ltd., Feb. 15, 1993, First Edition), plate thickness control differs depending on a rolling mill and a rolling method used. Therefore, it is necessary to consider a rolling mill and a rolling method in order to obtain a desired plate thickness. On the other hand, the thickness of the pressure-bonded material on the exit side of the roller can be calculated from values such as a pressure-bonding load, a plate width, a roll force function, and deformation resistance. Therefore, the pressure-bonding load is determined such that it is possible to set various conditions for obtaining a desired plate thickness according to the used rolling mill. Furthermore, the plate thickness is equal to the sum of the deformation of the rolling mill due to the pressure-bonding load and the roll setting position of the rolling mill. Therefore, in order to obtain a desired plate thickness, the plate thickness can be adjusted by changing the roll setting position.

In addition, as described in "Plate Rolling" (Corona Publishing Co., Ltd., first published on Oct. 25, 1960), a rational rolling plan is associated with a pressure-bonding load. The pressure-bonding load can be calculated from various conditions such as a thickness before rolling and a roll radius, and thus a rational rolling plan can be made without prescribing other conditions by determining the pressure-bonding load in advance.

In the manufacturing method according to this embodiment, a pressure-bonding load P in the clad rolling is set to $4.4 \times 10^3$ N/mm or more. When the length of a roller surface in the axial direction of the work rollers 103a (103b) (also referred to as a "width direction" in a direction orthogonal to the rolling direction and the stacking direction) is L (mm), the pressure-bonding load P can be obtained from the following formula (1) using the force P0 applied to the work rollers 103a.

$$P = P0/L \tag{1}$$

The pressure-bonding load P (N/mm) can be obtained as an estimate from the following formula (2).

$$P = Qp \cdot k \cdot \sqrt{(R \cdot (h1 - h2))}/L \tag{2}$$

Figure 6:
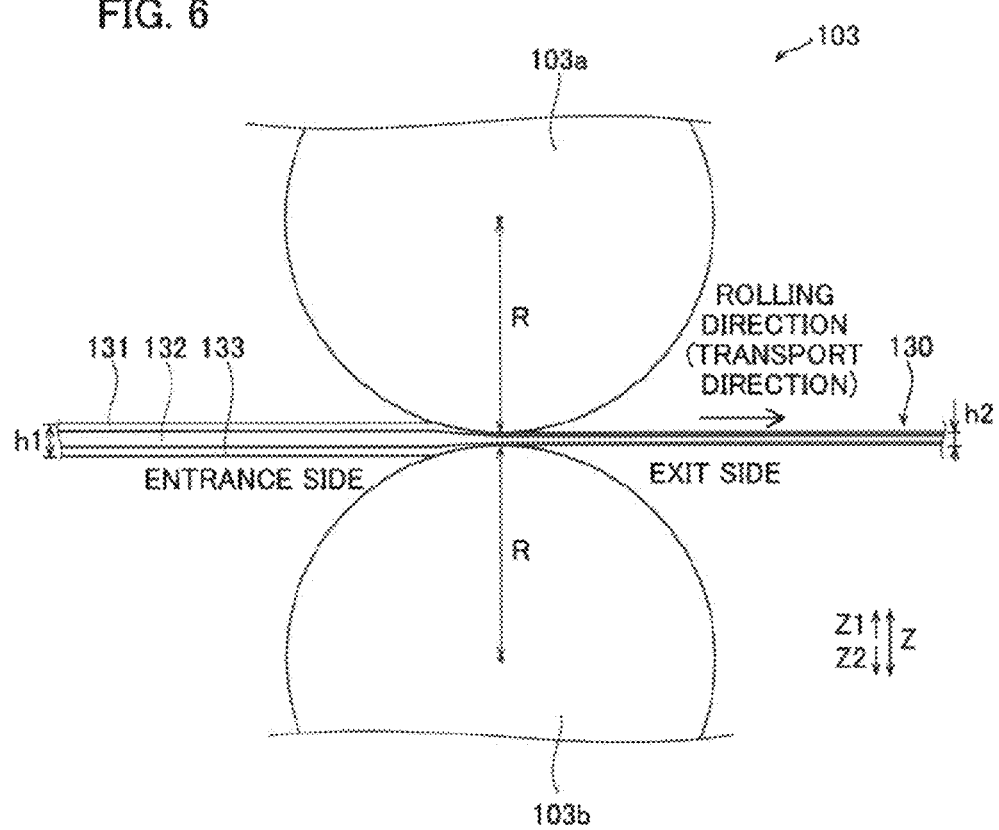
FIG. 6 An enlarged side view showing the roller configured to produce the clad material according to the embodiment of the present invention.

In the above formula (2), the roll force function (magnification compared with ideal deformation) is Qp, and the average deformation resistance (an average stress required for deformation between the rollers in a two-dimensional deformation state in the case in which the deformation in the width direction is ignored) is k (N/mm$^2$). Referring to FIG. 6, the radii of the work rollers 103a (103b) are R (mm), the total thickness of the SUS plate 131, the Cu plate 132, and the SUS plate 133 (rolled material) on the entrance side of the roller 103 is h1 (mm), and the thickness of the pressure-bonded material 130 on the exit side of the roller 103 is h2 (mm).

It is possible to increase the pressure-bonding load P by appropriately combining increasing the radii of the work rollers 103a (103b), increasing the radii of the work rollers 103a (103b), increasing a coefficient of dynamic friction between the work rollers 103a (103b) and the rolled material, increasing a rolling reduction (=(h1−h2)/h1) in the clad rolling, reducing a force (tension) along the rolling direction applied to the rolled material, reducing the transport speed of the rolled material, etc. When the clad rolling is performed continuously, it is possible to adjust the pressure-bonding load P while continuously performing the clad rolling by adjusting a pressure-bonding speed (transport speed) or tension.

In order to significantly reduce or prevent the occurrence of a portion of the SUS layer 31 having an excessively small thickness t2 and a portion of the SUS layer 33 having an excessively small thickness t3 in the clad material 30 (see FIG. 2) as a final product, the pressure-bonding load P is preferably $4.9 \times 10^3$ N/mm or more, more preferably $6.0 \times 10^3$ N/mm or more, and still more preferably and $6.8 \times 10^3$ N/mm or more. On the other hand, when the clad rolling is continuously performed, a low pressure-bonding speed is not preferable because the tact time of the clad material 30 increases. Therefore, when priority is given to reducing the tact time, it is preferable to set the pressure-bonding load P to $4.4 \times 10^3$ N/mm or more and a value in the vicinity of $4.4 \times 10^3$ N/mm.

As shown in FIG. 4, in the pressure-bonded material 130 immediately after the clad rolling, the thickness t12 of the SUS plate 131 and the thickness t13 of the SUS plate 133 are varied along the rolling direction. Consequently, there are portions of the SUS plates 131 and 133 respectively having a minimum thickness t12 min and a minimum thickness t13 min due to a partial difference in thickness.

Furthermore, in the manufacturing method according to this embodiment, the pressure-bonding load P in the clad rolling is set to $4.4 \times 10^3$ N/mm or more. Thus, in the cross-sectional view along the stacking direction (Z direction) of the pressure-bonded material 130, the minimum thickness t12 min of the SUS plate 131 in the stacking direction and the minimum thickness t13 min of the SUS plate 133 in the stacking direction can be set to 84% or more and less than 100% of the average thickness t12avg of the SUS plate 131 in the stacking direction and the average thickness t13avg of the SUS plate 133 in the stacking direction, respectively.

Thus, even when the variations in the thickness t12 of the SUS plate 131 and the thickness t13 of the SUS plate 133 along the rolling direction are further increased by performing further rolling (intermediate rolling and finish rolling described below) after the clad rolling. In the clad material 30 as the final product, the minimum thickness t2 min of the SUS layer 31 and the minimum thickness t3 min of the SUS layer 33 can be 70% or more and less than 100% of the average thickness t2avg and the average thickness t3avg, respectively.

The average thicknesses t12avg and t13avg of the SUS plates 131 and 133 may be obtained from a predetermined range (length) in the rolling direction of the clad material. The predetermined range (length) is not particularly limited as long as the same is in the range of one or more wavelengths of the wave of the interface formed in a wave shape, but is preferably at least about mm from the viewpoint of measurement reliability. Furthermore, the average thickness t12avg of the SUS plate 131 is the average of the thickness t12 of the SUS plate 131 in the pressure-bonded material 130, and the average thickness t13avg of the SUS plate 133 is the average of the thickness t13 of the SUS plate 133 in the pressure-bonded material 130.

Thereafter, if necessary, the length of the pressure-bonded material 130 in the width direction may be adjusted by cutting an end of the pressure-bonded material 130 in the width direction using an end cutting machine 104. Then, the thickness of the pressure-bonded material 130 is adjusted by performing the intermediate rolling on the pressure-bonded material 130 using a roller 105. Thus, it is possible to reduce thickness variations in each pressure-bonded material 130 (clad material 30). The number of passes for intermediate rolling can be selected as appropriate.

Then, diffusion annealing is performed using an annealing furnace 106 in which the internal temperature is set to a temperature exceeding the recrystallization temperature of the stainless steel making up the SUS plate 131. At this time, in order to significantly reduce or prevent coarsening of the grain size of the Cu plate 132 resulting from the annealing, it is preferable to perform the diffusion annealing under a temperature condition of 850° C. or more and 1000° C. or less. Thus, all the SUS plate 131, the Cu plate 132, and the SUS plate 131 are in a state in which the structure has been softened according to the material. At the interface between the SUS plate 131 and the Cu plate 132 and at the interface between the Cu plate 132 and the SUS plate 133, the layers form an interatomic bond and are firmly bonded by diffusion treatment.

Thereafter, finish rolling is performed in order to adjust the thickness of the pressure-bonded material 130 after the diffusion annealing. Consequently, the clad material 30 including the SUS layer 31, the Cu layer 32 roll-bonded to the SUS layer 31, and the SUS layer 33 roll-bonded to the side of the Cu layer 32 opposite to the SUS layer 31 shown in FIG. 2 is produced.

Thereafter, shape correction, slit cutting, press (punching) work, etc. are appropriately performed on the clad material 30 as necessary. Consequently, the chassis 3 made of the clad material 30 shown in FIG. 2 is produced.

In this embodiment, as shown in FIG. 4, at least the steps from the clad rolling to the slit cutting in a finishing step are continuously performed, and thus the tact time of the clad material 30 can be effectively reduced. The manufacturing method according to the present invention is not limited to a method in which the steps from the clad rolling to the slit cutting in the finishing step are continuously performed.

When rolling (general cold rolling) is performed on the press-bonded material 130 after the clad rolling, the average thickness of each layer is reduced in accordance with the rolling reduction, but the ratio of the average thickness of each layer is substantially equivalent and unchanged. Based on this viewpoint, the aforementioned average thickness t2avg of the SUS layer 31 of the clad material 30 (=t1×t12/(t12+t13+t14)) may be acquired by multiplying the thickness t1 (see FIG. 2) of the clad material 30 by the ratio (=t12/(t12+t13+t14)) of the thickness t12 of the prepared SUS plate 131 to the total thickness (t12+t13+t14) of the prepared SUS plate 131, Cu plate 132, and SUS plate 133. Similarly, the aforementioned average thickness t3avg of the SUS layer 33 of the clad material 30 (=t1×t13/(t12+t13+t14)) may be acquired by multiplying the thickness t1 of the clad material 30 by the ratio (=t13/(t12+t13+t14)) of the thickness t13 of the prepared SUS plate 133 to the total thickness of the prepared SUS plate 131, Cu plate 132, and SUS plate 133.

Furthermore, the aforementioned average thickness t12avg of the SUS plate 131 of the pressure-bonded 130 (=t11×t12/(t12+t13+t14)) may be acquired by multiplying the thickness t11 of the pressure-bonded material 130 by the ratio (=t12/(t12+t13+t14)) of the thickness t12 of the prepared SUS plate 131 to the total thickness (=t12+t13+t14) of the prepared SUS plate 131, Cu plate 132, and SUS plate 133. Similarly, the aforementioned average thickness t13avg of the SUS plate 133 of the pressure-bonded material 130 (=t11×t13/(t12+t13+t14)) may be acquired by multiplying the thickness t11 of the pressure-bonded material 130 by the ratio (=t13/(t12+t13+t14)) of the thickness t13 of the prepared SUS plate 133 to the total thickness (=t12+t13+t14) of the prepared SUS plate 131, Cu plate 132, and SUS plate 133.

Note that the average thicknesses t12avg and t13avg may be obtained by measuring the thicknesses t2, t3, t12, and t13 at a plurality of portions (ten or more portions, for example) of the corresponding layers and plates and calculating the averages thereof.

In the manufacturing method according to this embodiment, the thickness t14 (see FIG. 4) of the Cu plate 132 before the diffusion annealing (after the intermediate rolling) is preferably set to 20% or more of the thickness t14 (see FIG. 3) of the Cu plate 132 after the soft annealing (before the temper rolling). Thus, the grain size of the Cu or Cu alloy in the Cu layer 32 (the Cu plate 132 after the diffusion annealing) can be reduced to 150 µm or less. Consequently, the elongation of the clad material 30 is improved, and thus workability can be improved.

Advantageous Effects of this Embodiment

In this embodiment, the following advantageous effects are achieved.

In this embodiment, as described above, in the cross-sectional view along the stacking direction (Z direction), the minimum thickness t2 min of the SUS layer 31 in the stacking direction and the minimum thickness t3 min of the SUS layer 33 in the stacking direction are set to 70% or more and less than 100% of the average thickness t2avg of the SUS layer 31 in the stacking direction and the average thickness t3avg of the SUS layer 33 in the stacking direction, respectively. Accordingly, in the clad material 30, the thicknesses t2 and t3 of the SUS layer 31 and the SUS layer 33 in the stacking direction are equalized, and thus the occurrence of portions having excessively small thicknesses (less than 70% of the average thicknesses) in the SUS layer 31 and the SUS layer 33 can be significantly reduced or prevented. Therefore, when the chassis 3 making up the clad material 30 is welded to another member, for example, welding of another member to the portion of the SUS layer 31 having an excessively small thickness t2 or the portion of the SUS layer 33 having an excessively small thickness t3 can be significantly reduced or prevented, and thus a decrease in welding strength due to insufficient welding can be significantly reduced or prevented. In addition, it is possible to significantly reduce or prevent the occurrence of variations in characteristics such as mechanical strength in the product (chassis 3) produced from the clad material 30. Furthermore, the occurrence of the portion having an excessively small thickness in the SUS layer 31 and the portion having an excessively small thickness in the SUS layer 33 is significantly reduced or prevented such that it is possible to significantly reduce or prevent uncovering of the Cu layer 32 due to tearing or pinholes occurring in the SUS layer 31 and the SUS layer 33 at the time of rolling.

In this embodiment, as described above, the clad material 30 includes the SUS layer 31 made of stainless steel, the Cu layer 32 made of Cu or a Cu alloy and roll-bonded to the SUS layer 31, and the SUS layer 33 made of stainless steel and roll-bonded to the side of the Cu layer 32 opposite to the SUS layer 31. Accordingly, in the clad material 30, its mechanical strength and corrosion resistance can be ensured by the SUS layer 31 and the SUS layer 33 made of stainless steel while its conductivity and thermal conductivity can be ensured by the Cu layer 32 made of Cu or a Cu alloy. Consequently, the clad material 30 suitable for the chassis 3 that also serves as a heat sink can be provided.

In this embodiment, the percentage of the standard deviation of the minimum thickness t2 min of the SUS layer 31 with respect to the thickness t1 of the clad material and the percentage of the standard deviation of the minimum thickness t3 min of the SUS layer 33 with respect to the thickness t1 of the clad material 30 are preferably 1.5% or less. Accordingly, the minimum thickness t2 min of the SUS layer 31 in the stacking direction and the minimum thickness t3 min of the SUS layer 33 in the stacking direction are further equalized, and thus the occurrence of the portion having an excessively small thickness in the SUS layer 31 and the portion having an excessively small thickness in the SUS layer 33 (the portions having thicknesses of less than 70% of the average thicknesses) can be further significantly reduced or prevented. Consequently, the occurrence of the portion having an excessively small thickness in the SUS layer 31 and the portion having an excessively small thickness in the SUS layer 33 can be further significantly reduced or prevented. Therefore, the decrease in the welding strength as described above can be further significantly reduced or prevented. Furthermore, the variations in the characteristics of the chassis 3 produced from the clad material 30 as described above can be further significantly reduced or prevented.

In this embodiment, the SUS layer 31 and the SUS layer 33 are preferably both made of austenitic stainless steel. Accordingly, the austenitic stainless steel and the Cu or Cu alloy are both non-magnetic such that the entire clad material 30 can be non-magnetic. Accordingly, the electronic components 4a, for example, can be prevented from being adversely affected due to magnetization of the chassis 3 made of the clad material 30 and also serving as a heat sink.

In the manufacturing method according to this embodiment, in a state in which the SUS plate 131 made of stainless steel, the Cu plate 132 made of Cu or a Cu alloy, and the SUS plate 133 made of stainless steel are stacked in this order, the clad rolling is performed with a pressure-bonding load P of $4.4 \times 10^3$ N/mm or more. Accordingly, the clad rolling is performed with a sufficient pressure-bonding load P of $4.4 \times 10^3$ N/mm or more, and thus it is possible to significantly reduce or prevent each layer from being rolled in such a manner as to plastically deform non-uniformly due to a difference between the ductility of the SUS plate 131 and the SUS plate 133 made of stainless steel and the ductility of the Cu plate 132 made of Cu or a Cu alloy. Consequently, in the clad material 30, the non-uniform thickness t2 of the SUS layer 31 in the stacking direction and the non-uniform thickness t3 of the SUS layer 33 in the stacking direction can both be significantly reduced or prevented, and thus in the cross-sectional view along the stacking direction (Z direction), the minimum thickness t2 min of the SUS layer 31 in the stacking direction and the minimum thickness t3 min of the SUS layer 33 in the stacking direction can be set to 70% or more and less than 100% of the average thickness t2avg of the SUS layer 31 in the stacking direction and the average thickness avg of the SUS layer 33 in the stacking direction, respectively. Therefore, the occurrence of the portion having an excessively small thickness in the SUS layer 31 or the SUS layer 33 made of stainless steel can be significantly reduced or prevented.

In the manufacturing method according to this embodiment, the pressure-bonding load P is preferably set to $4.9 \times 10^3$ N/mm or more. Accordingly, the clad rolling can be performed with a more sufficient pressure-bonding load P, and thus it is possible to further significantly reduce or prevent each layer from being rolled in such a manner as to plastically deform non-uniformly.

In the manufacturing method according to this embodiment, it is assumed that the prepared Cu plate 132 has been work-hardened by being subjected to the temper rolling after the annealing. Accordingly, as the Cu plate 132 made of Cu or a Cu alloy, a Cu plate 132, the mechanical strength (such as 0.2% proof stress) of which has been improved due to accumulation of the internal stress (strain), can be used. Consequently, the mechanical strength of the Cu plate 132, which is lower in mechanical strength than the SUS plate 131 and the SUS plate 133 made of stainless steel, can be closer to the mechanical strength of the SUS plate 131 and the SUS plate 133. Therefore, the clad rolling can be performed on the metal plates having similar mechanical strength, and thus each layer is rolled in such a manner as to plastically deform more uniformly. Thus, the SUS plate 131, the Cu plate 132, and the SUS plate 133 can be sufficiently bonded to each other, and the thickness of each layer can be formed with a high degree of accuracy.

In the manufacturing method according to this embodiment, it is preferably assumed that the thickness of the prepared Cu plate 132 after the temper rolling is 60% or more and less than 100% of the thickness before the temper rolling. Accordingly, excessive accumulation of internal stress (strain) in the prepared Cu plate 132 due to the thickness of the prepared Cu plate 132 after the temper rolling of less than 60% of the thickness of the prepared Cu plate 132 before the temper rolling can be significantly reduced or prevented. Consequently, grain coarsening of the Cu layer 32 (Cu plate 132) due to large internal stress (strain) can be significantly reduced or prevented, and thus a decrease in the elongation (workability) of the clad material 30 due to the Cu layer 32 can be significantly reduced or prevented.

EXAMPLES

First to third examples performed to confirm the effect of the present invention are now described with reference to FIGS. 3, 4, and 7 to 12.

First Example

As the first example, in press-bonded materials each including a pair of a SUS plate (first metal plate) and a SUS plate (third metal plate) immediately after clad rolling, the thicknesses (minimum thicknesses tαmin) of portions of the SUS plates having the smallest thickness (thinnest portions) and the average values (average thicknesses tαavg) of the thicknesses of the SUS plates were acquired when the clad rolling was performed with different pressure-bonding loads P.

Specifically, pressure-bonded materials were produced by the manufacturing method shown in FIGS. 3 and 4. First, a Cu plate 132 (second metal plate) made of oxygen-free copper (C1020, JIS standards) and having a thickness t14 of 0.5 mm was prepared. This Cu plate had a long strip shape in a rolling direction. Then, as shown in FIG. 3, soft annealing was performed on the Cu plate 132 at a temperature higher than the recrystallization temperature of Cu making up the Cu plate 132, and then temper rolling was performed. Thus, the thickness t14 of the Cu plate 132 after the temper rolling was set to 0.4 mm (80% of the thickness t14 before the temper rolling), and the Cu plate was work-hardened to some extent.

A pair of SUS plates 131 and 133 (a first metal plate and a third metal plate) having a thickness of 0.2 mm, made of SUS316L (JIS standards), and commonly frequently used, were prepared. As the pair of SUS plates 131 and 133, sufficiently annealed SUS plates were used. Furthermore, the pair of SUS plates 131 and 133 had a long strip shape in the rolling direction.

The thickness ratio (t12:t14:t13) of the thickness t12 (=0.2 mm) of the SUS plate 131, the thickness t14 (=0.4 mm) of the Cu plate 132, and the thickness t13 (=0.2 mm) of the SUS plate 133 was 1:2:1. Prepared materials for the SUS plate 131 and the SUS plate 133 and the thicknesses thereof were the same, and thus the thickness ratios of the thickness (average thickness t12avg) of the SUS plate 131 and the thickness (average thickness t13avg) of the SUS plate 133 to the thickness of the pressure-bonded material 130 were substantially the same (25%). In this case, the SUS plate 131 and the SUS plate 133 can be collectively evaluated as SUS plates (the SUS plates 131 and 133) without distinguishing the SUS plate 131 from the SUS plate 133 in the pressure-bonded material 130.

Then, the clad rolling was performed in a state in which the SUS plate 131, the work-hardened Cu plate 132, and the SUS plate 133 were stacked in this order such that the strip-shaped pressure-bonded material 130 was produced. At this time, the rolling was performed such that the thickness t12 of the SUS plate 131, the thickness t14 of the Cu plate 132, and the thickness t13 of the SUS plate 133 after the clad rolling became 56% of the thickness t12, the thickness t14, and the thickness t13 before the clad rolling.

In the clad rolling, the SUS plate 131, the work-hardened Cu plate 132, and the SUS plate 133 were roll-bonded under any one of pressure-bonding conditions 1 to 13 shown in TABLE 1. Then, a cross-section (see FIG. 4) of the pressure-bonded material 130 immediately after the clad rolling in the stacking direction (Z direction), which was a cross-section along the rolling direction, was observed such that the thickness (minimum thickness t12 min) of the thinnest portion of the SUS plate 131 and the thickness (minimum thickness t13 min) of the thinnest portion of the SUS plate 133 were acquired.

Specifically, in the strip-shaped pressure-bonded material 130 produced with any one of thirteen types of pressure-bonding loads P ($4.0 \times 10^3$ N/mm (pressure-bonding condition 1) or more and $7.8 \times 10^3$ N/mm (pressure-bonding condition 13) or less) shown in TABLE 1, ten test regions having a range (length) of 15 mm in the rolling direction were acquired. At this time, five portions were randomly acquired in the vicinity of each of opposite ends of the strip-shaped pressure-bonded material 130 in the rolling direction. Then, in each of the ten test regions, the minimum thickness t12 min of the SUS plate 131 and the minimum thickness t13 min of the SUS plate 133 were acquired, the ten minimum thicknesses t12 min and the ten minimum thicknesses t13 min were collectively averaged, and the minimum thickness of the SUS plates (SUS plates 131 and 133) in the pressure-bonded material 130 was set to tαmin. Therefore, the above minimum thickness tαmin is based on measured values of twenty thicknesses obtained from the pressure-bonded material 130.

For each of the ten test regions, the thicknesses of five randomly selected portions of the SUS plate 131 was measured and averaged to acquire the average thickness t12avg of the SUS plate 131. Similarly, for each of the ten test regions, the thicknesses of five randomly selected portions of the SUS plate 133 were measured and averaged to acquire the average thickness t13avg of the SUS plate 133. Then, the average thickness t12avg of the five portions and the average thickness t13avg of the five portions obtained from the ten test regions were collectively averaged to obtain the average thickness tαavg of the SUS plates (SUS plates 131 and 133) of the pressure-bonded material 130. Therefore, the above average thickness tαavg is based on measured values of a hundred thicknesses obtained from the pressure-bonded material 130.

Next, the thickness ratio Rα1 (=(tαmin/t11)×100(%)) of the above minimum thickness tαmin of the SUS plates (SUS plates 131 and 133) to the thickness t11 of the entire pressure-bonded material 130 was calculated. Furthermore, the thickness ratio Rα2 (=(tαmin/tαavg)×100(%)) of the minimum thickness tαmin to the above average thickness tαavg of the SUS plates (SUS plates 131 and 133) with respect to the thickness t11 of the entire pressure-bonded material 130 was calculated. TABLE 1 shows the measurement results.

pressure-bonding conditions 1 to 3, Rα1 was 20.8% or less (21% or less), and Rα2 was 83.2% or less (less than 84%).

Evaluation criteria in TABLE 1 are determined based on whether or not the ratio of the minimum thicknesses to the average thicknesses of the SUS layers in a final product is 70% or more. For example, in a clad material having a thickness of 1 mm in which a layer thickness ratio of a SUS layer, a Cu layer, and a SUS layer is 1:2:1, the average thicknesses of the SUS layer 31 and the SUS layer 33 are 0.25 mm. When the ratio of the minimum thicknesses to the average thicknesses of the SUS layers in the final product of the clad material was 70% (0.175 mm), no crack was generated. However, when the ratio of the minimum thicknesses to the average thicknesses of the SUS layers in the final product of the clad material was 60% (0.150 mm), cracks were sometimes generated. This is conceivably because the SUS layers having higher strength and being less likely to extend than the Cu layer were excessively pulled in the rolling direction (longitudinal direction) during rolling. Furthermore, there is a concern that the thickness of the clad material and the thickness of each layer constituting the clad material may vary due to practical variations such

TABLE 1

|  | PRESSURE-BONDING LOAD P ($\times 10^3$ N/mm) | Rα1 (%) | Rα2 (%) | EVALUATION |
|---|---|---|---|---|
| PRESSURE-BONDING CONDITION 1 | 4.0 | 20.0 | 80.0 | x |
| PRESSURE-BONDING CONDITION 2 | 4.2 | 20.2 | 80.8 | x |
| PRESSURE-BONDING CONDITION 3 | 4.3 | 20.8 | 83.2 | x |
| PRESSURE-BONDING CONDITION 4 | 4.6 | 22.0 | 88.0 | ○ |
| PRESSURE-BONDING CONDITION 5 | 4.8 | 22.1 | 88.4 | ○ |
| PRESSURE-BONDING CONDITION 6 | 4.9 | 22.0 | 88.0 | ○ |
| PRESSURE-BONDING CONDITION 7 | 5.1 | 22.2 | 88.8 | ○ |
| PRESSURE-BONDING CONDITION 8 | 5.8 | 22.4 | 89.6 | ○ |
| PRESSURE-BONDING CONDITION 9 | 6.0 | 24.3 | 97.2 | ○ |
| PRESSURE-BONDING CONDITION 10 | 6.7 | 22.9 | 91.6 | ○ |
| PRESSURE-BONDING CONDITION 11 | 7.1 | 24.0 | 96.0 | ○ |
| PRESSURE-BONDING CONDITION 12 | 7.3 | 24.1 | 96.4 | ○ |
| PRESSURE-BONDING CONDITION 13 | 7.8 | 22.7 | 90.8 | ○ |

Figure 7:
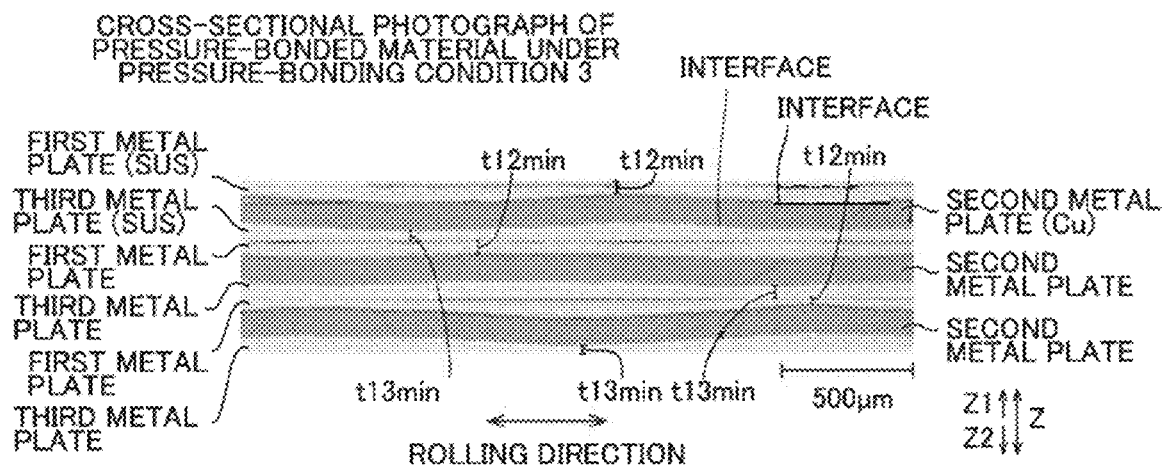
FIG. 7 A cross-sectional photograph of a pressure-bonded material under a pressure-bonding condition 3 in an experiment (first example) performed to confirm the effect of the present invention.
Figure 8:
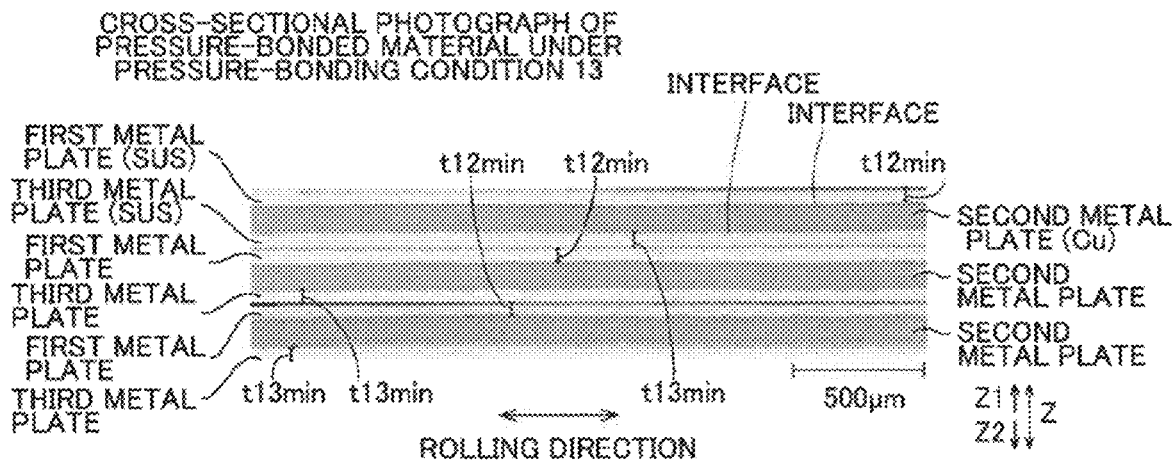
FIG. 8 A cross-sectional photograph of a pressure-bonded material under a pressure-bonding condition 13 in an experiment (first example) performed to confirm the effect of the present invention.

FIGS. 7 and 8 show a portion of a cross-sectional photograph of the pressure-bonded material under the pressure-bonding condition 3 and a portion of a cross-sectional photograph of the pressure-bonded material under the pressure-bonding condition 13, respectively. In FIGS. 7 and 8, three different portions of the same rolled material are stacked in the stacking direction.

(Results of First Example)

From the results shown in TABLE 1, as the pressure-bonding load P increased, both Rα1 (the thickness ratio of the minimum thickness tαmin to the thickness t11 of the pressure-bonded material 130) and Rα2 (the thickness ratio of the minimum thickness tαmin to the average thickness tαavg) tended to increase. In the pressure-bonded material subjected to roll-bonding with a pressure-bonding load P of $4.3 \times 10^3$ N/mm or less (less than $4.4 \times 10^3$ N/mm) under the as material characteristics and rolling. From such a viewpoint, the evaluation criteria in TABLE 1 was determined based on whether or not the thickness ratio Rβ2 was 70% or more at which no crack was generated.

The thickness ratios Rα1 shown in TABLE 1 were obtained by defining the thickness ratios Rα2 from another viewpoint (the minimum thicknesses tαmin with respect to the entire clad material). The thickness ratios Rα2 are thickness ratios of the minimum thicknesses tαmin to the average thicknesses tαavg of the SUS plates immediately after the clad rolling. In other words, the thickness ratios Rα1 and Rα2 shown in TABLE 1 are ratios at the stage during production of the final product. In the stage during production of the final product and the final product, the values of the thicknesses of the entire clad materials and the thicknesses of the respective layers are different, but theoretically, the ratios of the thicknesses of the respective layers to the thicknesses of the entire clad materials do not change. Thus, the ratios of the minimum thicknesses to the average thicknesses do not change due to further rolling. However, in practice, variations occur in the rolling operation, and thus even when Rα2 at the stage during production of the final product is 70% or more, the evaluation of the clad materials in which the ratios of the minimum thicknesses to the average thicknesses of the SUS layers of the final product are less than 70% is x (unsuitable). When Rα2 is 85% or more, the ratios of the minimum thicknesses to the average thicknesses of the SUS layers of the final product are highly likely to be 70% or more 70% by performing further rolling (intermediate rolling and finish rolling) after the clad rolling, and thus the evaluation of the clad materials is ○ (suitable).

In the case of the pressure-bonded materials under the pressure-bonding conditions 1 to 3, the variations in the minimum thicknesses are further increased by performing further rolling (intermediate rolling and finish rolling) after the clad rolling, and the minimum thicknesses of first layers and the minimum thicknesses of third layers in the clad materials as final products are conceivably less than 70% of the average thicknesses of the first layers and the average thicknesses of the third layers, respectively. Therefore, the pressure-bonding conditions 1 to 3 are marked with x (unsuitable) as their evaluation.

On the other hand, in the case of the pressure-bonded materials subjected to roll-bonding with a pressure-bonding load P of $4.4 \times 10^3$ N/mm or more under the pressure-bonding conditions 4 to 13, Rα1 became 22.0% or more (more than 20.8% and 21% or more), and Rα2 became 88.0% or more (more than 83.2% and 84% or more). This is conceivably because each layer was significantly reduced or prevented from being rolled in such a manner as to plastically deform non-uniformly due to a sufficient pressing load P of $4.4 \times 10^3$ N/mm or more. Even when further rolling (intermediate rolling and finish rolling) is performed on the pressure-bonded materials under the pressure-bonding conditions 4 to 13 after the clad rolling such that the variations in the minimum thicknesses are further increased, the minimum thicknesses of the first layers and the minimum thicknesses of the third layers in the clad materials as final products are conceivably 70% or more of the average thicknesses of the first layers and the average thicknesses of the third layers, respectively. Therefore, the pressure-bonding conditions 4 to 13 are marked with ○ (suitable) as their evaluation.

As shown in TABLE 1, the values of the thickness ratio Rα1 and the thickness ratio Rα2 of the pressure-bonded material subjected to roll-bonding with a pressure-bonding load P of $6.7 \times 10^3$ N/mm or more under the pressure-bonding condition 10 were smaller than the values of Rα1 and Rα2 of the pressure-bonded material subjected to roll-bonding with a pressure-bonding load P of $6.0 \times 10^3$ N/mm or more under the pressure-bonding condition 9. In addition, the values of Rα1 and Rα2 of the pressure-bonded material subjected to roll-bonding with a pressure-bonding load P of $7.8 \times 10^3$ N/mm or more under the pressure-bonding condition 13 were smaller than the values of the thickness ratio Rα1 and the thickness ratio Rα2 of the pressure-bonded material subjected to roll-bonding with a pressure-bonding load P of $7.3 \times 10^3$ N/mm or more under the pressure-bonding condition 12. These results are considered as follows.

A force P0 applied to the work rollers 103a is represented by the product of the pressure-bonding load P and the length L of the roller surface (see the above formula (1)). Therefore, when the length L of the roller surface is constant as in the first embodiment, the pressure-bonding load P and the force P0 applied to the work rollers 103a are in a proportional relationship. That is, as the pressure-bonding load P increases, the force P0 applied to the work rollers 103a also increases. From this viewpoint, the value of the thickness h2 of the pressure-bonded material 130 on the exit side of the roller 103 varied due to a variation in the force P0, and Rα1 and Rα2 conceivably happened to decrease under that influence.

When the thickness h2 of the pressure-bonded material 130 on the exit side of the roller 103 decreases, the plastic deformation ratio of each layer increases. Accordingly, it is difficult to obtain uniformity of the thickness h2 of the pressure-bonded material 130 on the exit side of the roller 103, and it is also difficult to obtain uniformity of the thickness of each layer. Consequently, it is difficult to obtain uniformity of the thickness h2, the thickness ratio Rα1, and the thickness ratio Rα2 of the pressure-bonded material 130 on the exit side of the roller 103, and the values may vary and may be small or large. However, although it is difficult to obtain uniformity, as can be seen by comparing the result of the pressure-bonding condition 4 with the result of the pressure-bonding condition 13, for example, the pressure-bonding load is increased such that the thickness ratio Rα1 and the thickness ratio Rα2 themselves gradually increase.

The tendency of a change of the value of Rα1 of the pressure-bonded material with respect to the pressure-bonding load P shown in TABLE 1 can be generally represented by a linear approximation curve having a slope of about 0.87 and an intercept of about 17.5 (a straight line suitable for data having a simple linear relationship). Similarly, the tendency of a change of the value of Rα2 of the pressure-bonded material with respect to the pressure-bonding load P shown in TABLE 1 can be generally represented by a linear approximation curve having a slope of about 3.46 and an intercept of about 69.8. Therefore, there is a positive correlation between the pressure-bonding load P and the values of Rα1 and Rα2 of the pressure-bonded material, and it can be confirmed that as the pressure-bonding load P increases, the values of Rα1 and Rα2 of the pressure-bonded material increase.

When P=4.3 ($\times 10^3$ N/mm) is substituted into a deformation approximation curve of Rα2, Rα2=84.678(%). When P=4.4 ($\times 10^3$ N/mm) is substituted, Rα2=85.024(%). When Rα2 is 85% or more as described above, the ratio of the minimum thickness to the average thickness of the SUS layer of the final product is highly likely to be 70% or more, and thus it is reasonable to set the lower limit of the pressure-bonding load P to $4.4 \times 10^3$ N/mm or more that results in Rα2=85.024(%).

From the cross-sectional photograph shown in FIG. 7, it has been clearly confirmable that the interface is formed in a wave shape in the pressure-bonded material under the pressure-bonding condition 3 in which the roll-bonding has been performed with a pressure-bonding load P of $4.3 \times 10^3$ N/mm. On the other hand, from the cross-sectional photograph shown in FIG. 8, it has been confirmable that formation of the interface in a wave shape is significantly reduced or prevented in the pressure-bonded material under the pressure-bonding condition 13 in which the roll-bonding has been performed with a pressure-bonding load P of $7.8 \times 10^3$ N/mm. Therefore, it has been confirmed that the degree (the magnitude of the undulation) of the wave shape of the interface is clearly different between the pressure-bonded material with x (unsuitable) as the evaluation and the pressure-bonded material with ○ (suitable) as the evaluation. As for the degree of the wave shape of the interface, when the minimum thickness with respect to the average thickness in the pressure-bonded material is small (the values of the thickness ratios Rα2 and Rβ2 are small), the amplitude of the wave at the interface increases, and thus it is known that the degree of the wave shape of the interface becomes larger (more wavy). In other words, the degree of the wave shape of the interface is improved by increasing the pressure-bonding load.

Second Example

In a second example, a clad material 30 as a final product was produced using the pressure-bonded material 130 under the pressure-bonding condition 6 (pressure-bonding load P=4.9×10³ N/mm) in the first example. Materials for a SUS plate 131 and a SUS plate 133 and the thicknesses thereof in the pressure-bonded material 130 were the same, and thus the thickness ratios of the thickness (average thickness t2avg) of a SUS layer 31 and the thickness (average thickness t3avg) of a SUS layer 33 to the thickness of the clad material 30 obtained by rolling the pressure-bonded material 130 were substantially the same (25%). In this case, the SUS layers (SUS layers 31 and 33) can be collectively evaluated without distinguishing the SUS layer 31 from the SUS layer 33 in the clad material 30. From such a viewpoint, the thickness (minimum thickness t2min) of a portion having the smallest thickness (thinnest portion) in the SUS layer 31 (first layer) of the clad material 30 and the thickness (minimum thickness t3min) of a portion having the smallest thickness (thinnest portion) in the SUS layer 33 (third metal plate) of the clad material 30 were measured, and the thickness (minimum thickness tβmin) of the portion having the smallest thickness (thinnest portion) in the SUS layers and the average value (average thickness tβavg) of the thicknesses of the SUS layers were acquired.

Specifically, intermediate rolling was performed using the roller 105 on the strip-shaped pressure-bonded material 130 under the pressure-bonding condition 6 (pressure-bonding load P=4.9×10³ N/mm) in the first example. At this time, the rolling was performed such that the thickness t11 of the pressure-bonded material 130 after the intermediate rolling was 67% of the thickness t11 of the pressure-bonded material 130 before the intermediate rolling.

Thereafter, diffusion annealing was performed on the pressure-bonded material under a temperature condition of 950° C. Then, in order to adjust the thickness of the pressure-bonded material 130 after the diffusion annealing, finish rolling was performed on the pressure-bonded material. At this time, the rolling was performed such that the thickness t11 of the pressure-bonded material 130 (clad material 30) after the finish rolling was 85% of the thickness t11 of the pressure-bonded material 130 before the finish rolling. Thus, the strip-shaped clad material 30 of an example of the present invention was produced. Fourteen strip-shaped clad materials 30 of the example of the present invention were prepared.

Meanwhile, a clad material of a comparative example with respect to the example of the present invention was produced. Specifically, a strip-shaped Cu plate made of Cu or a Cu alloy and having a sufficiently softened structure was prepared. Note that temper rolling was not performed on the strip-shaped Cu plate.

Then, in addition to the strip-shaped Cu plate, a pair of strip-shaped SUS plates made of the same stainless steel as in the aforementioned example of the present invention were prepared. The thickness ratio of the SUS plate, the Cu plate, and the SUS plate in the comparative example was the same as that in the example of the present invention.

Thereafter, similarly to the example of the present invention, in a state in which the SUS plate, the Cu plate, and the SUS plate were stacked in this order, clad rolling was performed by rolling and bonding using a roller such that a pressure-bonded material was produced. In the comparative example, unlike the example of the present invention, roll-bonding was performed with a pressure-bonding load P of 4.3×10³ N/mm (the pressure-bonding condition 3 in the first example). A change (rolling reduction) in the thickness of the pressure-bonded material before and after the clad rolling in the comparative example was the same as that in the example of the present invention.

Thereafter, intermediate rolling was performed on the pressure-bonded material, similarly to the example of the present invention. Then, diffusion annealing was performed on the pressure-bonded material under a temperature condition of 950° C. After that, finish rolling was performed on the pressure-bonded material, similarly to the example of the present invention such that the clad material of the comparative example was produced. Fifteen strip-shaped clad materials of the comparative example were prepared.

Then, in each of the fourteen clad materials of the example of the present invention and the fifteen clad materials of the comparative example, ten test regions having a range (length) of 15 mm in a rolling direction were acquired. At this time, five portions were randomly acquired in the vicinity of each of opposite ends of the strip-shaped pressure-bonded material in the rolling direction. Then, in each of the ten test regions, the minimum thickness t2 min of the SUS layer 31 and the minimum thickness t3 min of the SUS layer 33 were acquired, the ten minimum thicknesses t2 min and the ten minimum thicknesses t3 min were collectively averaged, and the minimum thickness of the SUS layers (SUS layers 31 and 33) in the clad material 30 was set to tβmin. Therefore, the above minimum thickness tβmin is based on measured values of twenty thicknesses obtained from the clad material.

For each of the ten test regions, the thicknesses of five randomly selected portions in the SUS layer 31 were measured and averaged to acquire the average thickness t2avg of the SUS layer 31. Similarly, for each of the ten test regions, the thicknesses of five randomly selected portions in the SUS layer 33 were measured and averaged to acquire the average thickness t3avg of the SUS layer 33. Then, the five average thicknesses t2avg and the five average thicknesses t3avg obtained from the ten test regions were collectively averaged to obtain the average thickness tβavg of the SUS layer (SUS layers 31 and 33) of the clad material 30. Therefore, the above average thickness tβavg is based on measured values of a hundred thicknesses obtained from the clad material 30.

Figure 9:
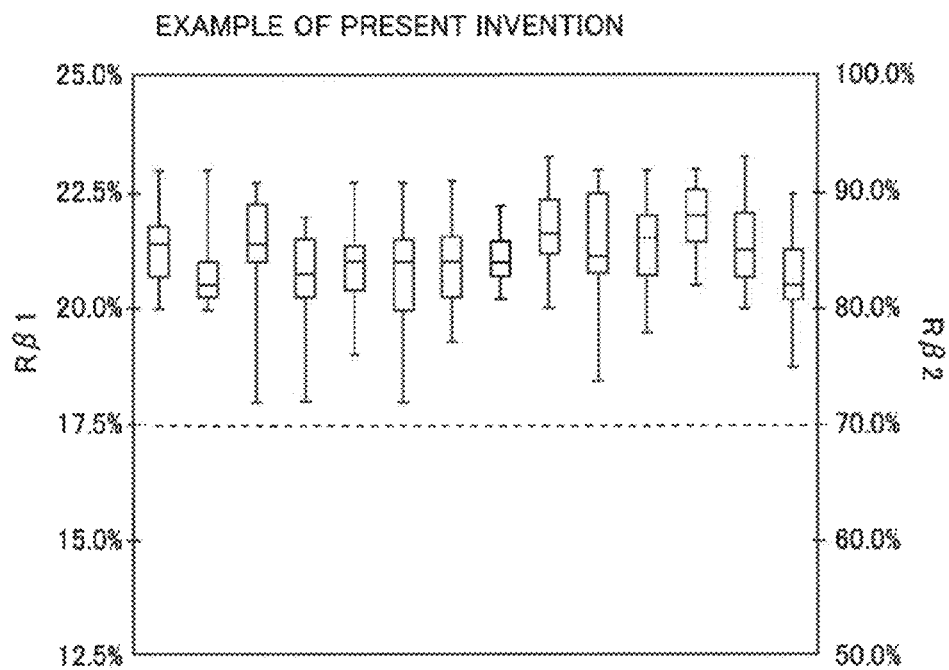
FIG. 9 A boxplot of an example of the present invention in an experiment (second example) performed to confirm the effect of the present invention.
Figure 10:
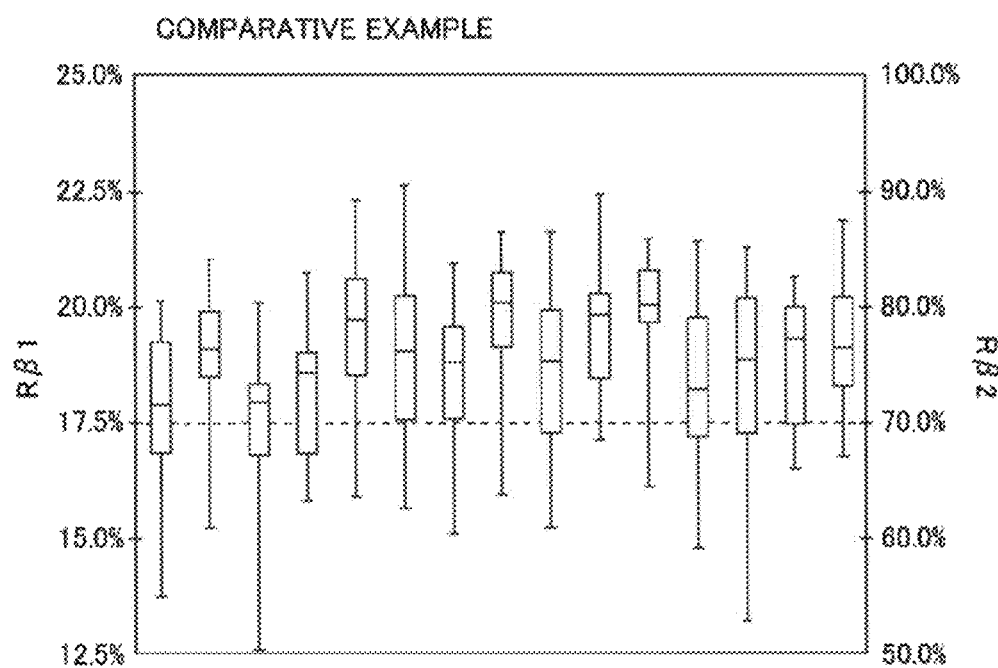
FIG. 10 A boxplot of a comparative example in the experiment (second example) performed to confirm the effect of the present invention.

Next, in each of the fourteen clad materials of the example of the present invention and the fifteen clad materials of the comparative example, the thickness ratio Rβ1 (=(tβmin/t1)× 100(%)) of the above minimum thickness tβmin of the SUS layers (SUS layers 31 and 33) to the thickness t1 of the entire clad material was calculated. Furthermore, the thickness ratio Rβ2 (=(t3 min/t3avg)×100(%)) of the minimum thickness tβmin to the above average thickness tβavg of the SUS layers (SUS layers 31 and 33) was calculated. These results are shown by a so-called boxplot. FIGS. 9 and 10 show a boxplot of the example of the present invention and a boxplot of the comparative example, respectively.

A bar graph relating to the frequencies of Rβ1 and Rβ2 in the clad material of the example of the present invention was prepared using two hundred and eighty (=(10 t2 mins+10 t3 mins)×14 clad materials) measured values of the minimum thicknesses t2 min and the minimum thicknesses t3 min acquired in the example of the present invention. Then, the average value Rβ1avg (=(ΣRβ1)/280) and the standard deviation σ (=√((Σ(Rβ1−Rβ1avg)$^2$)/280)) of Rβ1 of the example of the present invention were calculated. Similarly, a bar graph relating to the frequencies of Rβ1 and Rβ2 in the clad material of the comparative example was prepared using three hundred (=(10 t2 mins+10 t3 mins)×15 clad materials) measured values of the minimum thicknesses t2 min and the minimum thicknesses t3 min acquired in the comparative example. Then, the average value Rβ1avg (=(ΣRβ1)/300) and the standard deviation σ (=√((Σ(Rβ1−Rβ1avg)$^2$)/300)) of Rβ1 in the comparative example were calculated. The bar graph of the example of the present invention and the bar graph of the comparative example are shown in FIGS. 11 and 12, respectively.

(Results of Second Example)

Figure 11:
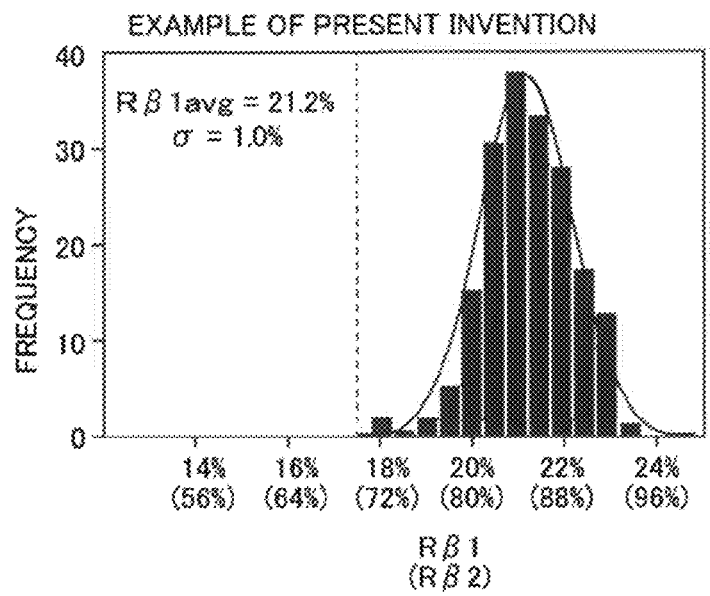
FIG. 11 A bar graph of the example of the present invention in the experiment (second example) performed to confirm the effect of the present invention.
Figure 12:
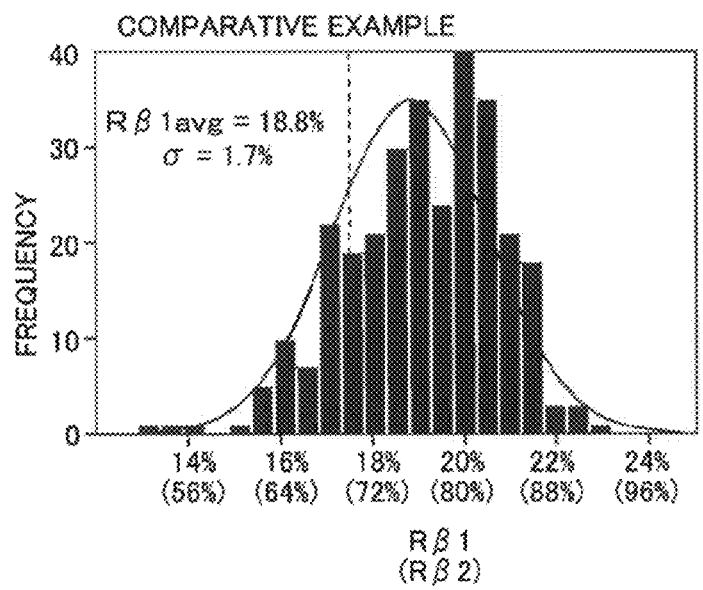
FIG. 12 A bar graph of the comparative example in the experiment (second example) performed to confirm the effect of the present invention.

In the clad material of the example of the present invention produced by performing the intermediate rolling and the finish rolling on the pressure-bonded material with a pressure-bonding load P of 4.9×10$^3$ N/mm (4.4×10$^3$ N/mm or more) (the pressure-bonded material under the pressure-bonding condition 6), the average value Rβ1avg of Rβ1 was 21.2% (see FIG. 11). Furthermore, as shown in FIG. 9, it has been confirmable that in the clad material, Rβ1 is 17.5% or more and Rβ2 is 70.0% or more. Thus, in the clad material of the example of the present invention, it has been confirmable that the occurrence of portions having an excessively small thickness in the SUS layers (the first layer and the third layer) made of stainless steel is significantly reduced or prevented. Furthermore, it has been confirmable that in each clad material, the first quartile of Rβ1 is 20% or more and the first quartile of Rβ2 is 80.0% or more. From these, it has been confirmable that in many clad materials, the occurrence of portions having an excessively small thickness in the SUS layers can be reliably significantly reduced or prevented.

As shown in FIG. 11, the standard deviation σ of Rβ1 in the clad material of the example of the present invention was 1.0% (1.5% or less), and a variation in Rβ1 was small. Thus, it has been confirmable that in a product (such as a chassis) produced from the clad material of the example of the present invention, the occurrence of variations in characteristics such as mechanical strength can be significantly reduced or prevented.

On the other hand, in the clad material of the comparative example produced by performing the intermediate rolling and the finish rolling on the pressure-bonded material with a pressure-bonding load P of 4.3×10$^3$ N/mm (less than 4.4×10$^3$ N/mm) (the pressure-bonded material under the pressure-bonding condition 3), the average value Rβ1avg of Rβ1 was 18.8% (see FIG. 12). Furthermore, as shown in FIG. 10, it has been confirmable that in the clad material, a part of Rβ1 is less than 17.5% and a part of Rβ2 is less than 70.0%. Thus, it has been confirmable that in the clad material of the comparative example, there is a possibility that the SUS layers (the first layer and the third layer) made of stainless steel include portions having excessively small thicknesses. In addition, it has been confirmable that in each clad material, even a part of the first quartile of Rβ1 is less than 17.5% and even a part of the first quartile of Rβ2 is less than 70.0%. From these, it has been confirmable that in the Cu layers of many clad materials, there is a possibility that the SUS layers include portions having excessively small thicknesses.

As shown in FIG. 12, the standard deviation σ of Rβ1 in the clad material of the comparative example was 1.7% (a value exceeding 1.5%), and a variation in Rβ1 was large. Thus, it has been confirmable that in a product (such as a chassis) produced from the clad material of the comparative example, variations in characteristics such as mechanical strength are likely to occur.

Here, Rα1 and Rα2 in the pressure-bonded material under the pressure-bonding condition 4 of the first example (produced with a pressure-bonding load within the scope of the present invention (claim 4)) were respectively the same as Rα1 and Rα2 in the pressure-bonded material under the pressure-bonding condition 6 (produced with a pressure-bonding load within the scope of the present invention (claim 4)). Therefore, even when Rβ1 and Rβ2 are measured similarly to the aforementioned second example using the pressure-bonded material under the pressure-bonding condition 4, it can be inferred that results having substantially no difference from Rβ1 and Rβ2 in the measurement of the second example performed using the pressure-bonded material under the pressure-bonding condition 6 are obtained. In other words, even when the pressure-bonded material under the pressure-bonding condition 4 is used, it can be inferred that in the clad material as the final product, Rβ1 is 17.5% or more, Rβ2 is 70.0% or more, and the standard deviation σ of Rβ1 is 1.0% (1.5% or less).

Furthermore, when Rα1 and Rα2 are large in the pressure-bonded material after the clad rolling, the degree of the wave shape of the interface is smaller than when Rα1 and Rα2 are small. Therefore, as described above, even when a variation in the minimum thickness is further increased by performing further rolling (intermediate rolling and finish rolling) after the clad rolling, it can be inferred that when Rα1 and Rα2 are large, Rβ1 and Rβ2 also become large in the clad material as the final product. Furthermore, it can be inferred that the standard deviation σ of Rβ1 becomes small due to the small degree of the wave shape of the interface.

In other words, when the clad material of the final product is produced using the pressure-bonded materials under the pressure-bonding conditions 5 and 7 to 13 in which the pressure-bonding load P is larger than that in the pressure-bonding condition 4 and Rα1 and Rα2 are larger than those in the pressure-bonding condition 4, it can be inferred that also in the clad material as the final product, Rβ1 and Rβ2 increase and the standard deviation σ of Rβ1 decreases. Therefore, even when the clad material of the final product is produced using the pressure-bonded materials under the pressure-bonding conditions 5 and 7 to 13, it can be inferred that in the clad material, Rβ1 is 17.5% or more and Rβ2 is 70.0% or more, and it can be inferred that the standard deviation σ of Rβ1 is less than 1.7% (probably 1.5% or less).

From the results of the first and second examples, as long as in the cross-sectional view along the stacking direction of the final product, the minimum thickness of the first layer in the stacking direction and the minimum thickness of the third layer in the stacking direction are 70% or more and less than 100% (the thickness ratio Rβ2 is 70% or more and less than 100%) of the average thickness of the first layer in the stacking direction and the average thickness of the third layer in the stacking direction, respectively, it is possible to significantly reduce or prevent a decrease in welding strength when the clad material is welded to another member, and to significantly reduce or prevent the occurrence of a variation in the mechanical strength of the clad material. Consequently, based on the finding that a clad material suitable for welding applications, for example, can be obtained, as the pressure-bonding load at the time of clad rolling at which the thickness ratio Rβ2 in the final product is 70% or more and less than 100%, a numerical range from $4.6 \times 10^3$ N/mm to $7.8 \times 10^3$ N/mm is obtained. As described above, the pressure-bonding load is set to $4.4 \times 10^3$ N/mm such that the minimum thickness of the first layer in the stacking direction and the minimum thickness of the third layer in the stacking direction are highly likely to be 70% or more of the average thickness of the first layer in the stacking direction and the average thickness of the third layer in the stacking direction. Thus, also when the pressure-bonding load is set to $4.4 \times 10^3$ N/mm, a similar effect is conceivably obtained. Therefore, it is reasonable to set the range of the pressure-bonding load to $4.4 \times 10^3$ N/mm or more and $7.8 \times 10^3$ N/mm or less.

In the first example in which the thickness ratio $R\alpha 2$ immediately after the clad rolling was obtained, the pressure-bonding conditions 1 to 3 were marked with x, and the pressure-bonding conditions 4 to 13 were marked with ○. In the second example, the thickness ratio $R\beta 2$ after the finish rolling was obtained for the comparative example of the pressure-bonding condition 3 (pressure-bonding load: $4.3 \times 10^3$ N/mm) with the largest thickness ratio $R\alpha 2$ (the minimum thickness of the SUS Layers) among the conditions marked with x in the first example and the example of the pressure-bonding condition 6 (pressure-bonding load: $4.9 \times 10^3$ N/mm) with the smallest thickness ratio $R\alpha 2$ (the minimum thickness of the SUS Layers) among the conditions marked with ○ in the first example. As shown in FIGS. 9 to 12, in the example, the thickness ratios $R\beta 2$ after the finish rolling in all the test materials were 70% or more, while in the comparative example, portions in which the thickness ratio $R\beta 2$ after the finish rolling was less than 70% occurred in all the test materials. From this, in the clad materials produced under the pressure-bonding conditions 1 and 2 with the thickness ratio $R\alpha 2$ smaller than that of the pressure-bonding condition 3 (pressure-bonding load: $4.3 \times 10^3$ N/mm), it is easy to imagine that the thickness ratio $R\beta 2$ (the minimum thickness of the SUS layers) after the finish rolling is smaller than that of the pressure-bonding condition 3. Therefore, in TABLE 1, the pressure-bonding condition 3 is x, and thus both the pressure-bonding conditions 1 and 2 are also x.

Third Example

In a third example, the grain size of a Cu layer was measured for the clad materials of the example of the present invention and the comparative example in the second example based on a comparison method of JIS H 0501. Furthermore, a tensile strength test based on JIS Z 2241 was performed on the clad materials of the example of the present invention and the comparative example such that tensile strength (a force at break) and 0.2% proof stress (a force when the elongation was 0.2%) as mechanical strength and elongation (((length at break−length before test)/length before test)×100(%)) as workability were measured. As magnetic characteristics, the relative magnetic permeability of the clad materials of the example of the present invention and the comparative example was measured. TABLE 2 shows the measurement results.

TABLE 2

|  | WORKABILITY | | MECHANICAL STRENGTH | | MAGNETIC CHARACTERISTICS RELATIVE MAGNETIC PERMEABILITY |
| --- | --- | --- | --- | --- | --- |
|  | GRAIN SIZE (mm) | ELONGATION (%) | TENSILE STRENGTH (MPa) | 0.2% PROOF STRESS (MPa) |  |
| EXAMPLE OF PRESENT INVENTION | 0.108 | 13.5 | 568 | 551 | 1.003 |
| COMPARATIVE EXAMPLE | >0.250 | 5.3 | 560 | 546 | 1.003 |

(Results of Third Example)

Regarding the workability, the clad material of the example of the present invention in which the grain size of the Cu layer was 0.150 mm or less (0.108 mm) showed an elongation of 13.5%, which was a value of 10% or more. That is, it can be said that the clad material of the example of the present invention has sufficient workability (deformability). On the other hand, in the clad material of the comparative example in which the grain size of the Cu layer exceeded 0.250 mm, the elongation was 5.3%, which was a value of less than 10%. That is, the clad material of the comparative example may not have sufficient workability. Consequently, it can be said that the grain size of the Cu layer is set to 0.150 mm or less such that sufficient workability can be imparted to the clad material.

As for the mechanical strength, no significant difference was observed between the example of the present invention and the comparative example in both the tensile strength and the 0.2% proof stress. Thus, it can be said that the clad material of the example of the present invention can be used for a structure such as a chassis. Furthermore, the relative magnetic permeability as the magnetic characteristics did not differ greatly between the example of the present invention and the comparative example, and it has been confirmable that each of the examples hardly magnetizes. Thus, it can be said that other components (electronic components, for example) can be prevented from being adversely affected due to magnetization of the chassis when the clad material of the example of the present invention is used for the chassis that also serves as a heat sink, for example.

Modified Examples

The embodiment and examples disclosed this time must be considered as illustrative in all points and not restrictive. The scope of the present invention is not shown by the above description of the embodiment and examples but by the scope of claims for patent, and all modifications (modified examples) within the meaning and range equivalent to the scope of claims for patent are further included.

For example, while the example in which the clad material 30 has a three-layer structure in which the SUS layer 31 (first layer) made of stainless steel, the Cu layer 32 (second layer) made of Cu or a Cu alloy, and the SUS layer 33 (third layer) made of stainless steel are stacked in this order has been shown in the aforementioned embodiment, the present invention is not restricted to this. In the present invention, the clad material may have a four-or-more-layer structure as long as the same includes the first layer made of stainless steel, the second layer made of Cu or a Cu alloy and roll-bonded to the first layer, and the third layer made of stainless steel and roll-bonded to the side of the second layer opposite to the first layer.

While the example in which the temper rolling, the clad rolling, the intermediate rolling, and the finish rolling are performed in order to produce the clad material 30 has been shown in the aforementioned embodiment, the present invention is not restricted to this. In the present invention, in order to produce the clad material, at least the clad rolling may be performed, and the temper rolling, the intermediate rolling, and the finish rolling may not be performed. For example, in a clad material produced by a process in which the intermediate rolling and the finish rolling shown in FIG. 4 are not performed, the thickness of the pressure-bonded material (pressure-bonded material 130) after the clad rolling is the same as that of the clad material (clad material 30) as a final product. The clad material (clad material 30) as a final product has a thickness level of 1.0 mm or less, 0.5 mm or less, 0.3 mm or less, or even 0.2 mm or less, for example. In order to easily and reliably perform the clad rolling, it is preferable to perform the temper rolling. In order to reduce a difference in the thickness of the clad material for each product, it is preferable to perform the intermediate rolling and the finish rolling.

While the example in which the clad material 30 is used as the chassis 3 of the portable device 100 has been shown in the aforementioned embodiment, the present invention is not restricted to this. In the present invention, the clad material may be used for applications other than the chassis of the portable device. For example, the clad material according to the present invention may be used for a conductive member of a battery. The clad material according to the present invention is suitable for applications in which it is necessary to satisfy one or both of mechanical strength and corrosion resistance and one or both of conductivity and heat conductivity.

DESCRIPTION OF REFERENCE NUMERALS

- 30: clad material
- 31: SUS layer (first layer)
- 32: Cu layer (second layer)
- 33: SUS layer (third layer)
- 131: SUS plate (first metal plate)
- 132: Cu plate (second metal plate)
- 133: SUS plate (third metal plate)

The invention claimed is:

1. A method for manufacturing a clad material, comprising:

clad rolling for rolling and bonding a first metal plate made of stainless steel, a second metal plate made of Cu or a Cu alloy, and a third metal plate made of stainless steel in a state in which the first metal plate, the second metal plate, and the third metal plate are stacked in this order; wherein the clad rolling is performed with a pressure-bonding load of $4.4\times10^3$ N/mm or more such that the clad material including a first layer made of the first metal plate, a second layer made of the second metal plate and roll-bonded to the first layer, and a third layer made of the third metal plate and roll-bonded to a side of the second layer opposite to the first layer, the clad material having an overall thickness of 1 mm or less, in which in a cross-sectional view along a stacking direction, a minimum thickness of the first layer in the stacking direction and a minimum thickness of the third layer in the stacking direction are 70% or more and less than 100% of an average thickness of the first layer in the stacking direction and an average thickness of the third layer in the stacking direction, respectively, is produced, the second metal plate is subjected to temper rolling, a grain size of the second layer made of Cu or a Cu alloy is 0.150 mm or less, and an elongation of the clad material is 8% or more and 13.5% or less.

2. The method for manufacturing a clad material according to claim 1, wherein the pressure-bonding load is set to $4.9\times10^3$ N/mm or more.

3. The method for manufacturing a clad material according to claim 1, wherein the method further comprises work hardening the second metal plate subjecting the second metal plate to the temper rolling after annealing.

4. The method for manufacturing a clad material according to claim 3, wherein the temper rolling is performed in such manner that a thickness of the second metal plate after the temper rolling is 60% or more and less than 100% of the thickness of the second metal plate before the temper rolling.

* * * * *